US012635238B2

(12) United States Patent
Fu et al.

(10) Patent No.: US 12,635,238 B2
(45) Date of Patent: May 19, 2026

(54) DISPLAY SUBSTRATE AND MANUFACTURING METHOD THEREOF, AND DISPLAY DEVICE

(71) Applicants: FUZHOU BOE OPTOELECTRONICS TECHNOLOGY CO., LTD., Fuzhou (CN); BOE TECHNOLOGY GROUP CO., LTD., Beijing (CN)

(72) Inventors: Wanxia Fu, Beijing (CN); Liangliang Li, Beijing (CN); Xiaolong Chen, Beijing (CN); Zhouyu Chen, Beijing (CN); Bin Lin, Beijing (CN); Zengjie Lin, Beijing (CN); Zengrong Li, Beijing (CN)

(73) Assignees: FUZHOU BOE OPTOELECTRONICS TECHNOLOGY CO., LTD., Fuzhou (CN); BOE TECHNOLOGY GROUP CO., LTD., Beijing (CN)

( * ) Notice: Subject to any disclaimer, the term of this patent is extended or adjusted under 35 U.S.C. 154(b) by 545 days.

(21) Appl. No.: 18/019,267

(22) PCT Filed: Nov. 30, 2021

(86) PCT No.: PCT/CN2021/134572
§ 371 (c)(1),
(2) Date: Feb. 2, 2023

(87) PCT Pub. No.: WO2023/097496
PCT Pub. Date: Jun. 8, 2023

(65) Prior Publication Data
US 2024/0258326 A1 Aug. 1, 2024

(51) Int. Cl.
H10D 86/40 (2025.01)
H10D 86/01 (2026.01)

(52) U.S. Cl.
CPC ....... H10D 86/421 (2025.01); H10D 86/0231 (2025.01); H10D 86/441 (2025.01)

(58) Field of Classification Search
CPC .......................... H10D 86/421; H10D 86/441
See application file for complete search history.

(56) References Cited

U.S. PATENT DOCUMENTS 7,750,987 B2    7/2010  Byun et al.
8,183,070 B2    5/2012  Kim et al.
(Continued)

FOREIGN PATENT DOCUMENTS

CN    1553267 A  *  12/2004
CN    1743935 A     3/2006
(Continued)

*Primary Examiner* — Peter M Albrecht
(74) *Attorney, Agent, or Firm* — Dilworth & Barrese. LLP.; Michael J. Musella, Esq.

(57) ABSTRACT

A display substrate, manufacturing method thereof, and a display device. The display substrate includes a base substrate and a semiconductor layer and a conductive layer on the base substrate. The semiconductor layer includes a channel region and a doped region pattern of a transistor; the conductive layer includes a data line, and a first electrode and a second electrode of the transistor. An extension direction of an overlapping portion of the semiconductor layer with the data line is the same as an extension direction of the data line, and the semiconductor layer includes a first protrusion portion, and a size of an interval between an edge of the first protrusion portion away from the data line and the edge of the data line is greater than 0 and smaller than 3.0 microns.

18 Claims, 10 Drawing Sheets

(56) References Cited

U.S. PATENT DOCUMENTS

| | | | |
|---|---|---|---|
| 8,493,541 | B2 | 7/2013 | Xie et al. |
| 11,087,985 | B2 | 8/2021 | Liu |
| 11,171,244 | B2 | 11/2021 | Yeh et al. |
| 2006/0131581 | A1 | 6/2006 | Kim et al. |
| 2009/0121234 | A1* | 5/2009 | Jeon ..................... H10D 86/441 257/72 |
| 2009/0294781 | A1* | 12/2009 | Kim ..................... H10D 86/441 257/88 |
| 2022/0100318 | A1 | 3/2022 | Wang et al. |

FOREIGN PATENT DOCUMENTS

| | | | |
|---|---|---|---|
| CN | 101598876 | A | 12/2009 |
| CN | 101807584 | A | 8/2010 |
| CN | 102237305 | A | 11/2011 |
| CN | 103199060 | A | 7/2013 |
| CN | 107634035 | A | 1/2018 |
| CN | 109524419 | A | 3/2019 |
| CN | 110648923 | A | 1/2020 |
| CN | 110867458 | A | 3/2020 |
| CN | 111290658 | A | 6/2020 |
| CN | 112071867 | A | 12/2020 |

* cited by examiner

DISPLAY SUBSTRATE AND MANUFACTURING METHOD THEREOF, AND DISPLAY DEVICE

TECHNICAL FIELD

Embodiments of the present disclosure relate to a display substrate and a manufacturing method thereof, and a display device.

BACKGROUND

At present, amorphous silicon (A-Si) thin film transistors (TFT) are widely used in the driving backplane of liquid crystal display devices. In order to improve the tact time, the active semiconductor layer and the source-drain metal layer are often semi-exposed by the same mask to form TFT.

SUMMARY

Embodiments of the present disclosure provide a display substrate, a manufacturing method thereof, and a display device.

An embodiment of the present disclosure provides a display substrate, which includes a base substrate and a semiconductor layer and a conductive layer on the base substrate. The semiconductor layer is on the base substrate, the semiconductor layer includes a channel region and a doped region pattern of a transistor; the conductive layer is stacked with the semiconductor layer, and located at a side of the semiconductor layer away from the base substrate, the conductive layer includes a data line, and a first electrode and a second electrode of the transistor electrically connected with the doped region pattern, the first electrode is electrically connected with the data line, an extension direction of an overlapping portion of the semiconductor layer with the data line is the same as an extension direction of the data line, and the semiconductor layer includes a first protrusion portion which is not covered by the data line and protrudes relative to an edge of the data line, the first protrusion portion is arranged at the edge of the data line, and a size of an interval between an edge of the first protrusion portion away from the data line and the edge of the data line is a first size, and the first size is greater than 0 and smaller than 3.0 microns.

For example, according to an embodiment of the present disclosure, a portion of an edge of the semiconductor layer protruding from an edge of the first electrode is a second protrusion portion, which is arranged at the edge of the first electrode, and a size of an interval between an edge of the second protrusion portion away from the first electrode and the edge of the first electrode is a second size, and the second size is greater than the first size.

For example, according to an embodiment of the present disclosure, the first protrusion portion includes a first step and a second step which are stacked, the first step is located between the second step and the base substrate, and a size of an interval between an edge of the first step and the edge of the data line is a first step size, and a size of an interval between an edge of the second step and the edge of the data line is a second step size; a ratio of the first step size to the second step size ranges from 2 to 25.

For example, according to an embodiment of the present disclosure, a material of the first step includes amorphous silicon, and a material of the second step includes doped amorphous silicon.

For example, according to an embodiment of the present disclosure, the data line includes at least one conductive layer, and an angle between a side wall of the data line and a surface of a side of the second step away from the base substrate ranges from 30 to 80 degrees.

For example, according to an embodiment of the present disclosure, the second protrusion portion includes a third step and a fourth step which are stacked, the third step is located between the fourth step and the base substrate, and a size of an interval between an edge of the third step and the edge of the first electrode is a third step size, and a size of an interval between an edge of the fourth step and the edge of the first electrode is a fourth step size; the first step size is smaller than the third step size.

For example, according to an embodiment of the present disclosure, a material of the third step includes amorphous silicon, and a material of the fourth step includes doped amorphous silicon.

For example, according to an embodiment of the present disclosure, a ratio of the first step size to the second step size is smaller than a ratio of the third step size to the fourth step size.

For example, according to an embodiment of the present disclosure, the transistor further includes a gate electrode which is located between the semiconductor layer and the base substrate, and an orthographic projection of the second protrusion portion on the base substrate is located within an orthographic projection of a film layer where the gate electrode is located on the base substrate.

For example, according to an embodiment of the present disclosure, the display substrate further includes: a plurality of sub-pixels, each of the plurality of sub-pixels including a pixel electrode, the pixel electrode being located at a side of the conductive layer away from the base substrate, the second electrode is electrically connected with the pixel electrode; the semiconductor layer further includes a third protrusion portion overlapping the second electrode and protruding relative to an edge of the second electrode, the third protrusion portion surrounds at least part of the edge of the second electrode, and a size of a smallest interval between an edge of the third protrusion portion away from the second electrode and the edge of the second electrode is a third size, and the third size is greater than the first size.

For example, according to an embodiment of the present disclosure, the display substrate further includes: gate lines, arranged in the same layer as the gate electrode and electrically connected with the gate electrode, the plurality of sub-pixels are arrayed along a row direction and a column direction, and two adjacent sub-pixel columns form a sub-pixel column group; the data line extends in the column direction, the gate lines extend in the row direction, and the gate lines include a plurality of first sub-gate lines and a plurality of second sub-gate lines; the data line is located between two adjacent sub-pixel column groups, and two columns of sub-pixels in the sub-pixel column group are electrically connected with the same data line; the sub-pixel column group includes a plurality of sub-pixel rows, and the first sub-gate line and the second sub-gate line are respectively arranged on both sides of each of the plurality of sub-pixels row in the column direction, and a gate line pair including the first sub-gate line and the second sub-gate line is between adjacent sub-pixel rows.

For example, according to an embodiment of the present disclosure, a ratio of the second step size to the fourth step size ranges from 0.8 to 1.2.

An embodiment of the present disclosure provides a display device, which includes the abovementioned display substrate.

An embodiment of the present disclosure provides a manufacturing method of a display substrate, which includes: providing a base substrate; forming a semiconductor material layer on the base substrate; forming a conductive material layer on a side of the semiconductor material layer away from the base substrate; and forming an etching mask on a side of the conductive material layer away from the semiconductor material layer, the etching mask includes a first mask portion, the first mask portion includes a first sub-mask portion and a second sub-mask portion, the second sub-mask portion is on at least one side of the first sub-mask portion, and the second sub-mask portion is at an edge of the first mask portion, and a thickness of the first sub-mask portion is greater than that of the second sub-mask portion in a direction perpendicular to the base substrate, after the etching mask is formed, the manufacturing method further includes: patterning the conductive material layer and the semiconductor material layer with the first mask portion as a mask to form a data line and a first semiconductor pattern between the data line and the base substrate, the first semiconductor pattern includes a first protrusion portion which is not covered by the data line and protrudes relative to an edge of the data line, the first protrusion portion is arranged at the edge of the data line, and a size of an interval between an edge of the first protrusion portion away from the data line and the edge of the data line is a first size; and the first size is greater than 0 and smaller than 3.0 microns.

For example, according to an embodiment of the present disclosure, patterning the conductive material layer and the semiconductor material layer with the first mask portion as a mask includes: etching the conductive material layer with the first mask portion as a mask to form a data line pattern; etching the semiconductor material layer with the first mask portion as a mask to form a first semiconductor pattern layer after forming the data line pattern.

For example, according to an embodiment of the present disclosure, patterning the conductive material layer and the semiconductor material layer with the first mask portion as a mask includes: wet etching the conductive material layer with the first mask portion as a mask to form the data line pattern, and dry etching the semiconductor material layer with the first mask portion as a mask to synchronously etch edges of the first mask portion and the semiconductor material layer.

For example, according to an embodiment of the present disclosure, the etching mask further includes a second mask portion, and the second mask portion includes a third sub-mask portion located at an edge position, and a thickness of the third sub-mask portion is the same as the thickness of the first sub-mask portion in the direction perpendicular to the base substrate; after the etching mask is formed, the manufacturing method further includes: patterning the conductive material layer and the semiconductor material layer with the second mask portion as a mask to form a first electrode and a second electrode of a transistor and a second semiconductor pattern located between the first electrode and the second electrode of the transistor and the base substrate, the second semiconductor pattern includes a channel region and a doped region pattern of the transistor, and a protrusion portion of an edge of the second semiconductor pattern protruding relative to an edge of the first electrode is a second protrusion portion, the first electrode and the second electrode are both electrically connected with the doped region pattern, the first electrode is electrically connected with the data line, and a size of an interval between an edge of the second protrusion portion away from the first electrode and the edge of the first electrode is a second size, and the second size is greater than the first size.

For example, according to an embodiment of the present disclosure, patterning the conductive material layer and the semiconductor material layer with the second mask portion as a mask includes: etching the conductive material layer with the second mask portion as a mask to form a transistor source-drain electrode pattern; after forming the transistor source-drain electrode pattern, etching the semiconductor material layer with the second mask portion as a mask to form a second semiconductor pattern layer.

For example, according to an embodiment of the present disclosure, after etching the semiconductor material layer with the first mask portion and the second mask portion as masks to form the first semiconductor pattern layer and the second semiconductor pattern layer, the manufacturing method further includes: simultaneously ashing the first mask portion and the second mask portion, in a direction perpendicular to the base substrate, a thickness of the first mask portion which is ashed is smaller than that of the first sub-mask portion which is not ashed.

For example, according to an embodiment of the present disclosure, after the first mask portion and the second mask portion are simultaneously ashed, the manufacturing method further includes: etching the data line pattern with the first mask portion which is ashed as a mask to form the data line; after the data line is formed, etching an edge of the first semiconductor pattern layer with the first mask portion which is ashed as a mask to form a first step and a second step, the first semiconductor pattern includes the first step and the second step, the first step is located between the second step and the base substrate, and a size of an interval between an edge of the first step and the edge of the data line is a first step size, and a size of an interval between an edge of the second step and the edge of the data line is a second step size; a ratio of the first step size to the second step size ranges from 2 to 25.

For example, according to an embodiment of the present disclosure, the first mask portion in the etching mask is formed by using a half-tone mask or a slit mask.

BRIEF DESCRIPTION OF DRAWINGS

In order to more clearly explain the technical scheme of the embodiments of the present disclosure, the following will briefly introduce the drawings of the embodiments. Obviously, the drawings in the following description only relate to some embodiments of the present disclosure, but not limit the present disclosure.

Figure 1:
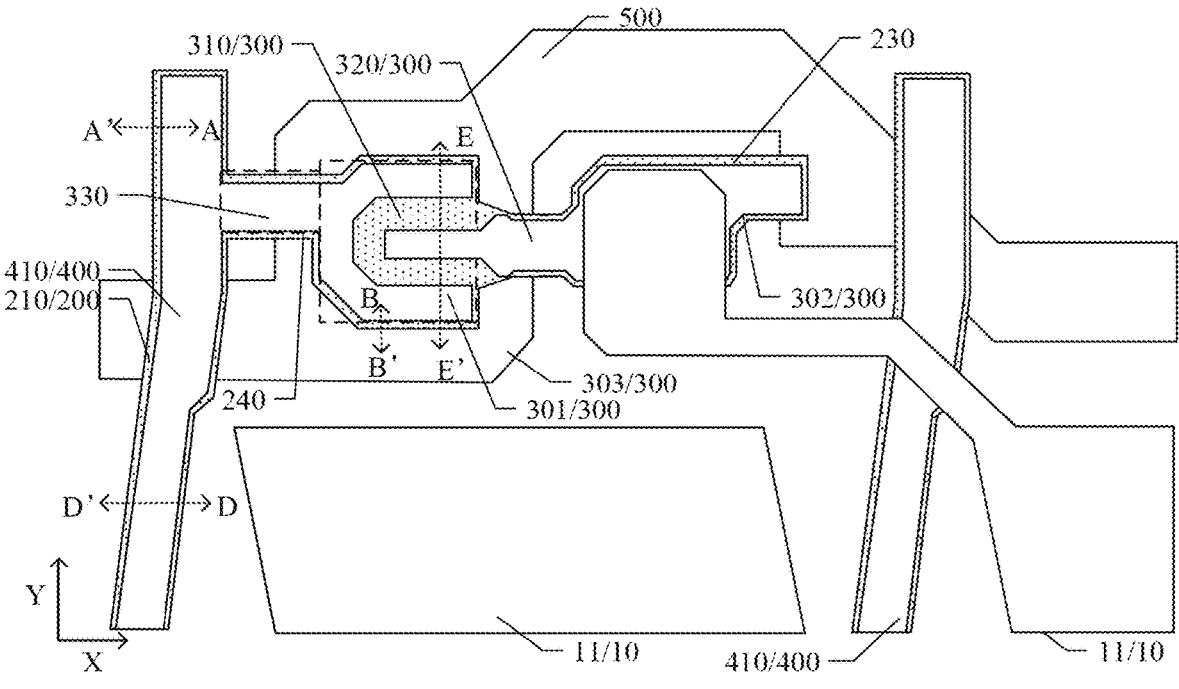
FIG. 1 is a schematic diagram of a partial plane structure of a display substrate provided according to an embodiment of the present disclosure.
Figures 6B, 6C:
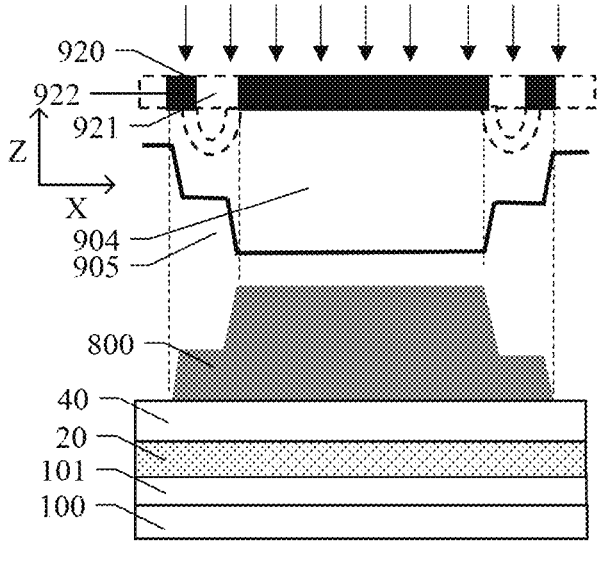
Figure 6D:
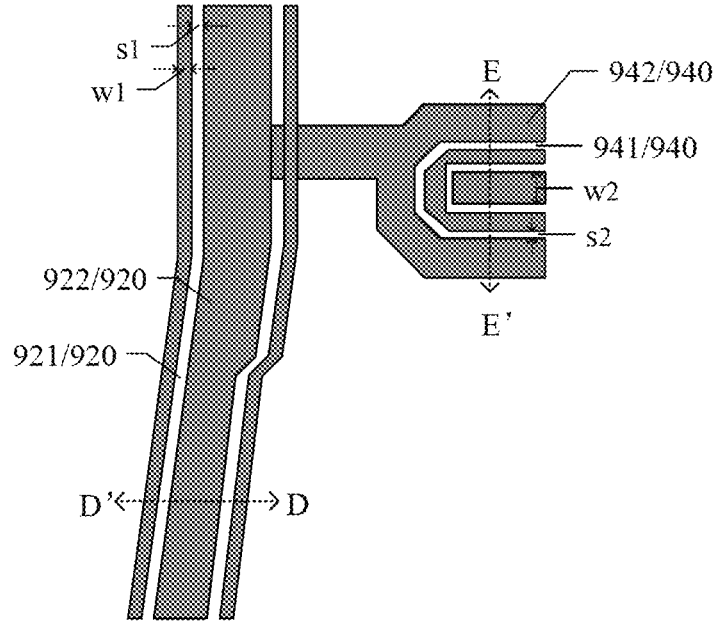
Figure 7A:
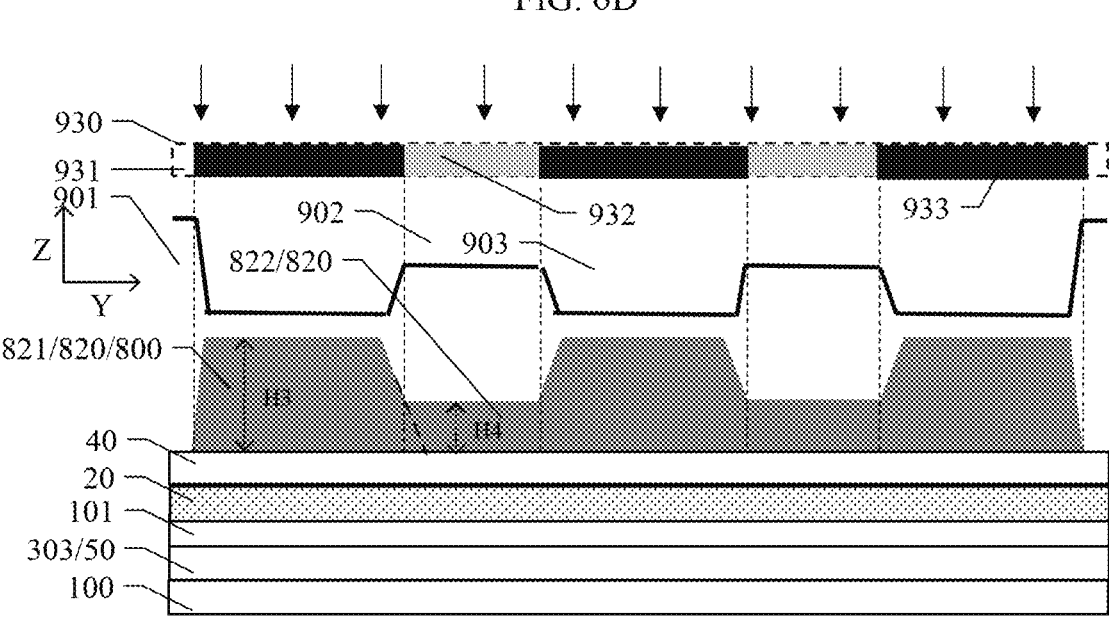
Figure 7B:
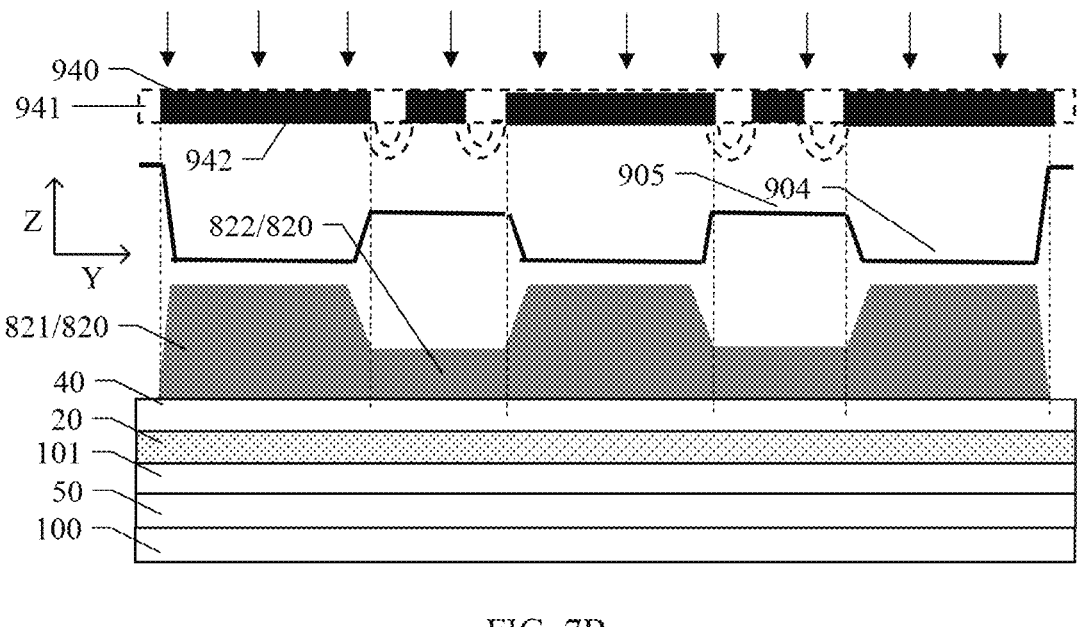
Figure 7C:
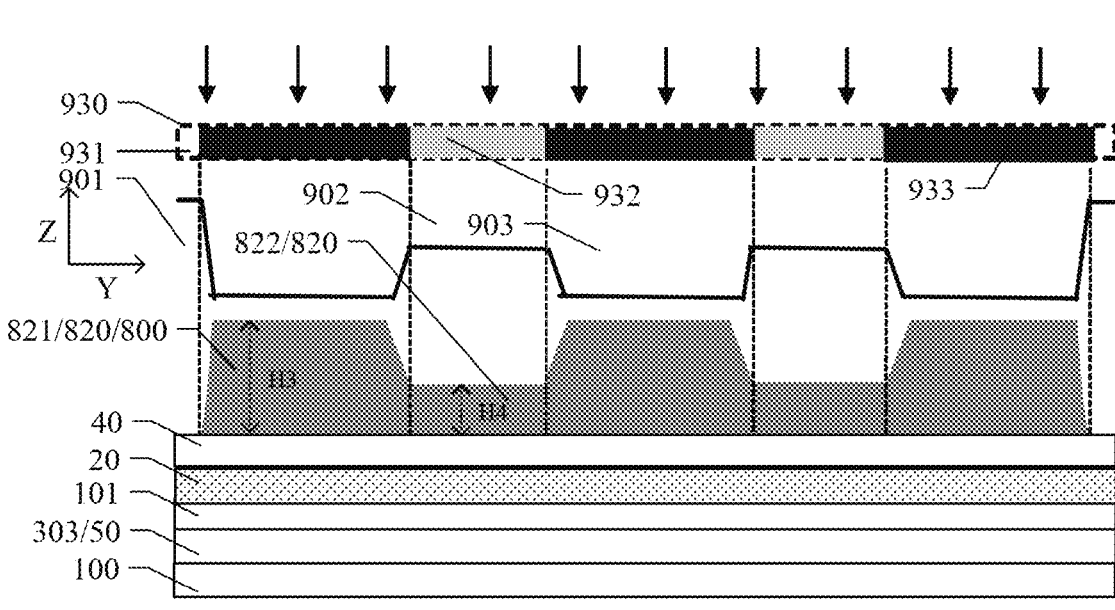
Figure 8:
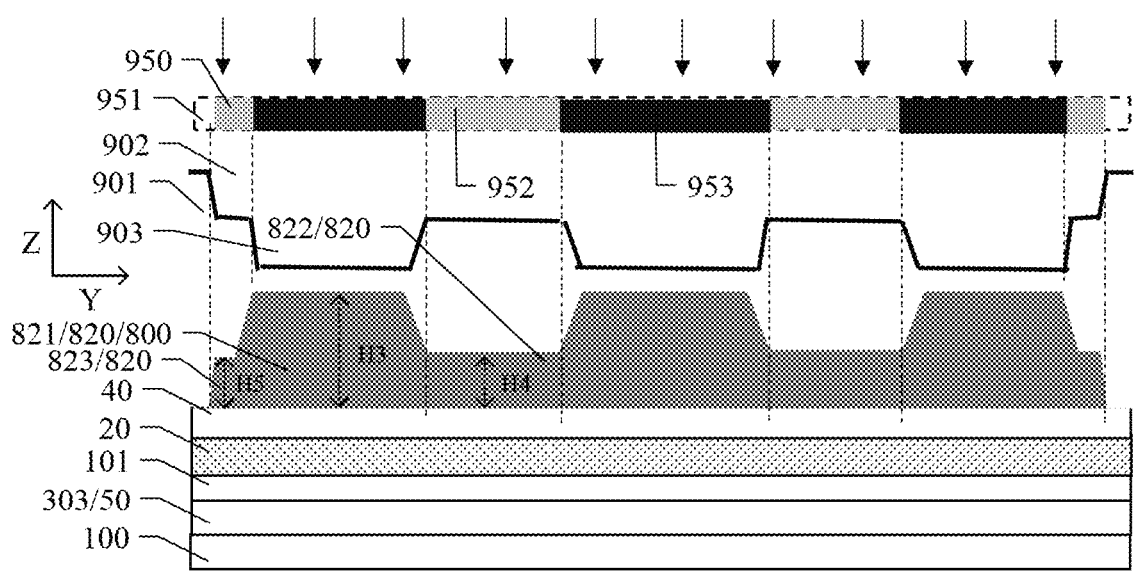
Figure 9:
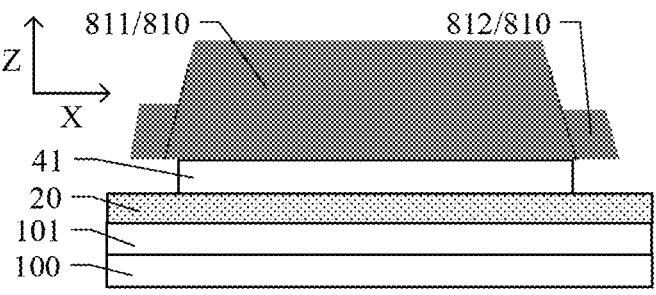
Figure 10:
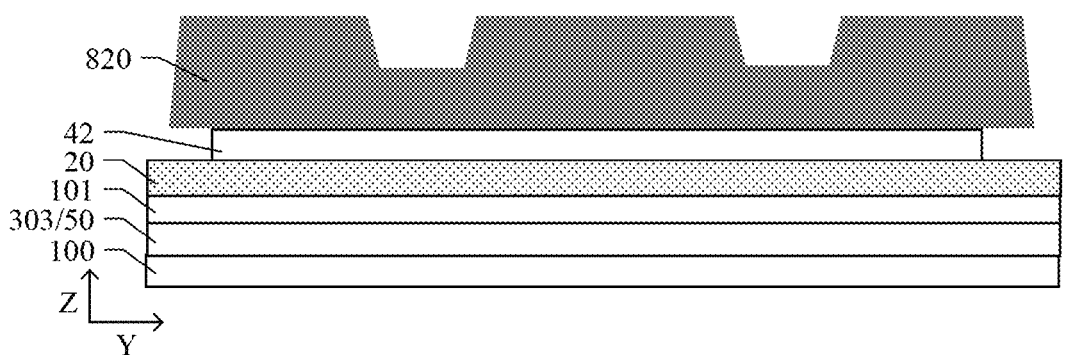
Figure 11:
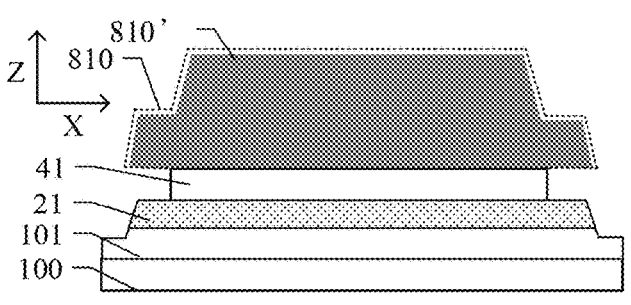
Figure 12:
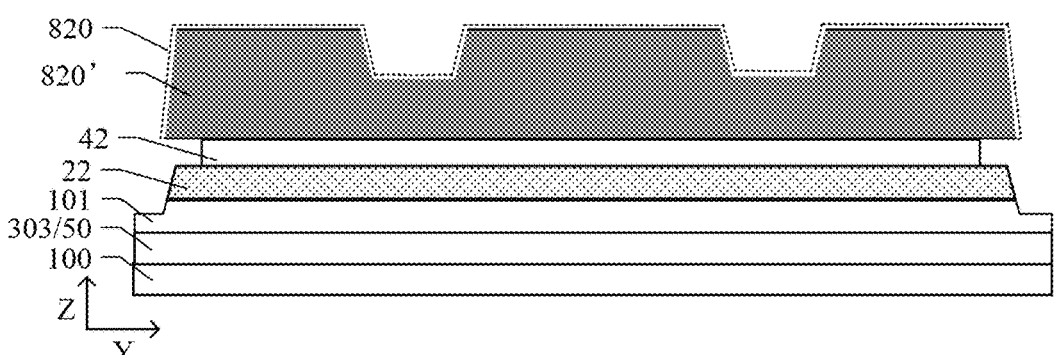
Figure 13:
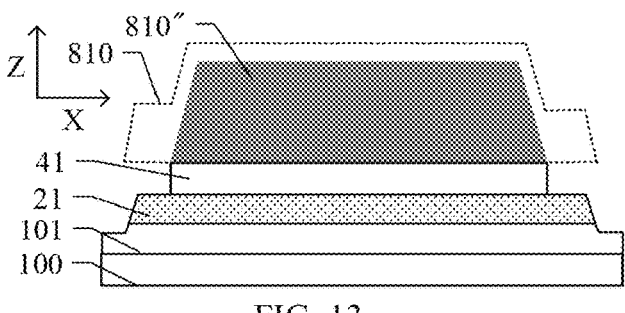
Figure 14:
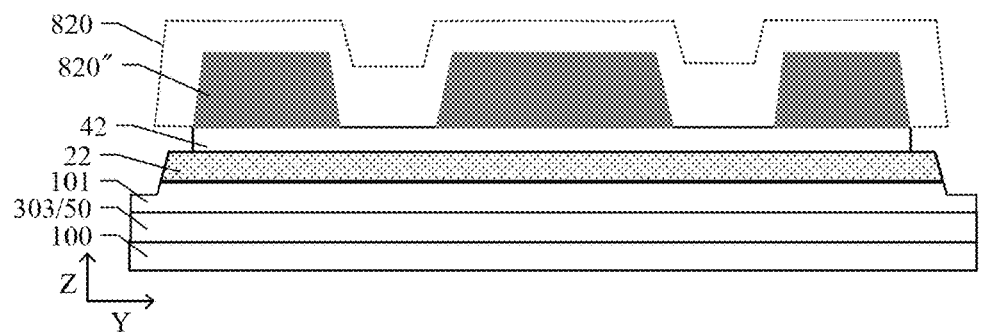
Figure 15:
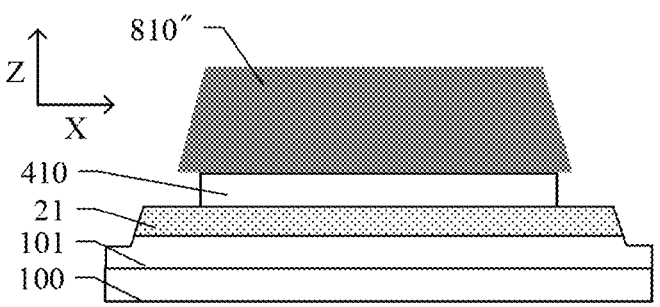
Figure 16:
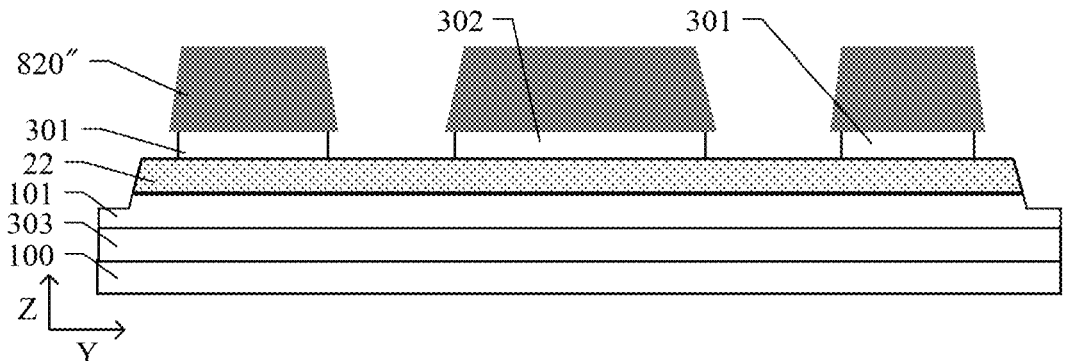
Figure 17:
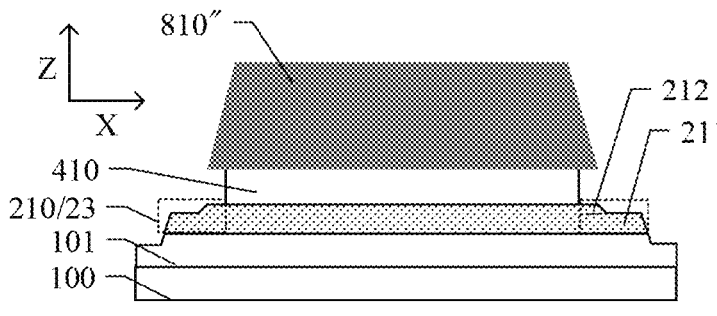
Figure 18:
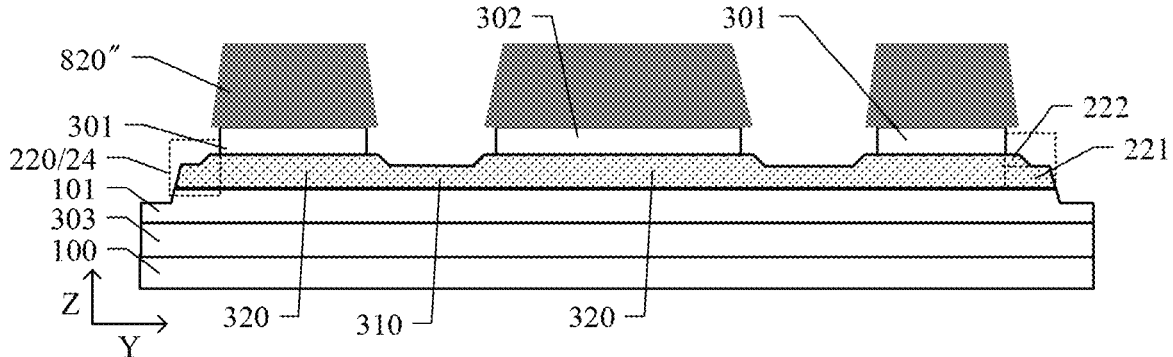

FIG. 6D is a plan structure diagram of a slit mask shown in FIG. 6B and FIG. 7B;

FIG. 7A to FIG. 7C are schematic diagrams of a method of manufacturing a partial cross-sectional structure of a display substrate taken along line EE' shown in FIG. 1;

FIG. 8 is a schematic diagram of another method of manufacturing a partial cross-sectional structure of the display substrate taken along the line EE' shown in FIG. 1;

FIG. 9 is a schematic diagram of forming a data line pattern by using a first mask portion as a mask;

FIG. 10 is a schematic diagram of forming a transistor source-drain pattern by using a second mask portion as a mask;

FIG. 11 is a schematic diagram of patterning a semiconductor material layer by using a first mask portion as a mask to form a first semiconductor pattern layer;

FIG. 12 is a schematic diagram of patterning a semiconductor material layer by using a second mask portion as a mask to form a second semiconductor pattern layer;

FIG. 13 is a schematic diagram after ashing the first mask portion which is etched;

FIG. 14 is a schematic diagram after ashing the second mask portion which is etched;

FIG. 15 is a schematic diagram after etching the data line pattern by using the first mask portion which is ashed as a mask;

FIG. 16 is a schematic diagram after etching the transistor source-drain electrode pattern by using the ashed second mask portion as a mask;

FIG. 17 is a schematic diagram after etching the first semiconductor pattern layer by using the first mask portion which is ashed as a mask; and FIG. 18 is a schematic diagram after etching the second semiconductor pattern layer by using the ashed second mask portion as a mask.

DETAILED DESCRIPTION

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects.

Features such as "parallel", "vertical" and "identical" used in the embodiments of the present disclosure all include features such as "parallel", "vertical" and "identical" in a strict sense, as well as situations where "approximately parallel", "approximately vertical" and "approximately identical" contain certain errors, which are within the acceptable deviation range for a specific value determined by a person of ordinary skill in the art in the case of considering the measurement and the errors related to the measurement of a specific quantity (for example, limitations of measurement system). For example, "approximately" can refer to within one or more standard deviations, or within 10% or 5% of the stated value. When the quantity of a component is not specified in the following of the embodiment of the present disclosure, it refers to that the component can be one or more, or can be understood as at least one. "at least one" refers to one or more, and "multiple" refers to at least two.

In the research, the inventor(s) of the present application found that the channel of thin film transistor manufactured by data layer semi-exposure (SDT) process includes two wet etching and two dry etching (2W2D) processes, and the above 2W2D processes easily lead to the existence of long active layer protrusion portion (which can be called active layer tail, Act Tail) at the edge of a source-drain metal layer pattern (such as data lines). If the size of the active layer protrusion portion exceeds 2 microns, it may affect the size of product design margin and product performance.

In the case where the size of the active layer protrusion portion is long, the parasitic capacitance between the signal line overlapping with the data line and the data line will easily increase, resulting in the delay of signal transmission (RC Delay), and it will also easily lead to the generation of undesirable phenomena such as line image retention and insufficient charging rate.

In the case where the active layer protrusion portion is illuminated (such as by backlight), the active layer protrusion portion will generate photo-generated carriers and become conductors; in the case where the active layer protrusion portion is not illuminated, the active layer protrusion portion is an insulating layer, and the current values generated by the active layer protrusion portion in dark state and illuminated state are different, which easily affects the stability of products. Under the action of AC backlight, the different positions of the active layer protrusion portion are exposed to different light conditions, which easily leads to poor water ripples in the display device.

Embodiments of the present disclosure provide a display substrate, a manufacturing method thereof, and a display device. The display substrate includes a base substrate, and a semiconductor layer and a conductive layer located on the base substrate. The semiconductor layer includes a channel region and a doped region pattern of a transistor; the conductive layer is stacked with the semiconductor layer, and is located on a side of the semiconductor layer away from the base substrate. The conductive layer includes a data line and a first electrode and a second electrode of the transistor electrically connected with the doped region pattern, and the first electrode is electrically connected with the data line. An extension direction of an overlapping portion of the semiconductor layer with the data line is the same as an extension direction of the data line. The semiconductor layer includes a first protrusion portion which is not covered by the data line and protrudes relative to an edge of the data line. The first protrusion portion is arranged at the edge of the data line, and a size of an interval between an edge of the first protrusion portion away from the data line and the edge of the data line is a first size, and the first size is greater than 0 and smaller than 3.0 microns. In the present disclosure, by setting the size of the first protrusion portion protruding from the edge of the semiconductor layer relative to the edge of the data line to be greater than 0 and smaller than 3 microns, it is beneficial to reduce the size of the product design margin, improve the product performance, and reduce the probability of poor display of the display device. In addition, the extension direction of the overlapping portion of the semiconductor layer and the data line is the same as that of the data line in the present disclosure, that is, the semiconductor layer with the same extension direction as the data line is also arranged between the data line and the base substrate, so that the semiconductor layer and the data line layer can use one mask in terms of technology, which saves the mask and improves the production efficiency.

The display substrate, the manufacturing method thereof and the display device provided by the embodiments of the present disclosure are described below with reference to the drawings.

Figure 2:
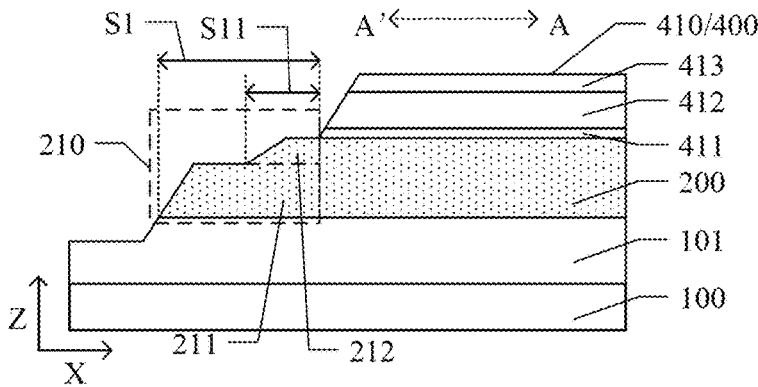
FIG. 2 is a schematic diagram of a partial cross-sectional structure taken along line AA' shown in FIG. 1.

FIG. 1 is a schematic diagram of a partial plane structure of a display substrate provided according to an embodiment of the present disclosure, and FIG. 2 is a schematic diagram of a partial cross-sectional structure taken along line AA' shown in FIG. 1. As illustrated in FIG. 1 and FIG. 2, the display substrate includes a base substrate 100 and a semiconductor layer 200 and a conductive layer 400 on the base substrate 100. The semiconductor layer 200 is located on the base substrate 100, and includes a channel region 310 and a doped region pattern 320 of the transistor 300. The conductive layer 400 is stacked with the semiconductor layer 200 and located on a side of the semiconductor layer 200 away from the base substrate 100. The conductive layer 400 includes a data line 410 and a first electrode 301 and a second electrode 302 of the transistor 300 electrically connected to the doped region pattern 320. The first electrode 301 is electrically connected to the data line 410. An extension direction of the overlapping portion of the semiconductor layer 200 and the data line 410 is the same as an extension direction of the data line 410. The semiconductor layer 200 includes a first protrusion portion 210 which is uncovered by the data line 410 and protrudes relative to the edge of the data line 410. The first protrusion portion 210 is arranged at the edge of the data line 410, and a size of an interval between an edge of the first protrusion portion 210 away from the data line 410 and the edge of the data line 410 is a first size S1, which is greater than 0 and smaller than 3.0 microns. In the embodiment of the present application, by setting the size of the first protrusion portion protruding from the edge of the semiconductor layer relative to the edge of the data line to be greater than 0 and smaller than 3 microns, it is beneficial to reduce the size of the product design margin, improve the product performance, and reduce the probability of poor display of the display device.

For example, the size of the first protrusion portion protruding from the edge of the semiconductor layer relative to the edge of the data line is small, which is beneficial to reduce the influence of the first protrusion portion protruding from the edge of the data line on other structures. In addition, by reducing the size of the first protrusion portion, the probability that the first protrusion portion is irradiated by the light of the backlight source to generate carriers can be reduced as much as possible, and the stability of the display substrate can be improved.

For example, as illustrated in FIG. 1, a part of the semiconductor layer 200 overlapping with the data line 410 has the same extension direction as the data line 410, which is arranged in the same layer as the channel region 310 and the doped region pattern 320 of the transistor 300, but has different shapes.

For example, FIG. 1 schematically shows that the conductive layer 400 in the region circled by the dotted line is the first electrode 301 of the transistor 300, and the first electrode 301 can be electrically connected to the data line 410 through the connection portion 330. For example, the data line 410, the first electrode 301, and the connection portion 330 may have an integrated structure. For example, the first electrode 301 and the second electrode 302 of the transistor 300 are spaced apart, and the semiconductor layer 200 between the first electrode 301 and the second electrode 302 can be a channel region, which is called a channel region.

For example, as illustrated in FIG. 1 and FIG. 2, the surface of the conductive layer 400 is in contact with the surface of the semiconductor layer 200.

For example, as illustrated in FIG. 1 and FIG. 2, an orthographic projection of at least part of the data line 410 on the base substrate 100 falls within an orthographic projection of the semiconductor layer 200 on the base substrate 100. For example, the extension direction of the overlapping portion of the semiconductor layer 200 and the data line 410 and the extension direction of the data line 410 may both be the Y direction shown in the figure.

For example, as illustrated in FIG. 1, the channel region 310 and the doped region pattern 320 of the transistor 300 may be an integrated structure. For example, the doped region pattern 320 may include a source electrode region and a drain electrode region, one of the first electrode 301 and the second electrode 302 is electrically connected with the source electrode region, and the other of the first electrode 301 and the second electrode 302 is electrically connected with the drain electrode region. For example, the doped region pattern 320 is covered by the first electrode 301 and the second electrode 302, so that the ohmic contact between the doped region pattern and the first electrode and the second electrode can be increased. In the embodiment of the present disclosure, the source electrode region and the drain electrode region of the transistor may be identical in structure, so the source electrode region and the drain electrode region of the transistor may be indistinguishable in structure, thus they can be interchanged as required.

For example, as illustrated in FIG. 1 and FIG. 2, the semiconductor layer 200 overlapping the data line 410 includes a middle portion covered by the data line 410 and an edge portion uncovered by the data line 410, and the edge portion uncovered by the data line 410 includes the first protrusion portion 210. For example, the first protrusion portion 210 is located at a position other than the edge of the data line 410.

For example, as illustrated in FIG. 1 and FIG. 2, the number of data lines 410 may be multiple, each data line 410 may extend in the Y direction, and a plurality of data lines 410 are arranged in the X direction, and the first protrusion portion 210 may include a portion on at least one side of the data lines 410 in the X direction or a portion on at least one side of the data lines 410 in the Y direction. For example, the first protrusion portion 210 may include two portions located on both sides of the data line 410 in the X direction, and the widths of the two portions in the X direction may be the same or different. For example, the first protrusion portion 210 may include two portions located on both sides of the data line 410 in the Y direction, and the widths of the two portions in the Y direction may be the same or different. The above X direction and Y direction can be interchanged.

For example, as illustrated in FIG. 1 and FIG. 2, the first protrusion portion 210 may extend in the Y direction, and the width of the first protrusion portion 210 in the X direction may be the first size S1. For example, the first protrusion portion 210 may extend in the X direction, and the width of the first protrusion portion 210 may be the first size S1.

For example, the first size S1 may be in a range from 0.5 to 3 microns. For example, the first size S1 may be in a range from 1 to 2 microns. For example, the first size S1 is not greater than 1.8 microns. For example, the first size S1 is not greater than 1.6 microns. For example, the first size S1 is not greater than 1.4 microns. For example, the first size S1 is not greater than 1.3 microns.

Figure 3:
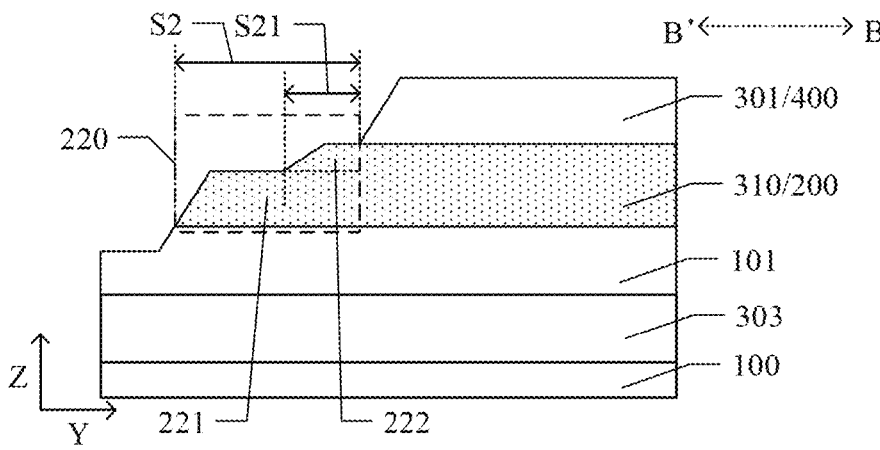
FIG. 3 is a schematic diagram of a partial cross-sectional structure taken along line BB' shown in FIG. 1.

FIG. 3 is a schematic diagram of a partial cross-sectional structure taken along line BB' shown in FIG. 1. For example, as illustrated in FIG. 1 to FIG. 3, the part of the edge of the channel region 310 protruding from the edge of the first electrode 301 of the transistor 300 is the second protrusion portion 220, which is arranged at the edge of the first electrode 301. A size of an interval between an edge of the second protrusion portion 220 away from the first electrode 301 and the edge of the first electrode 301 is a second size S2, and the second size S2 is greater than the first size S1. In the embodiment of the present disclosure, by setting the size of the first protrusion portion of the edge of the semiconductor layer relative to the edge of the data line to be smaller than the size of the second protrusion portion of the edge of the semiconductor layer relative to the edge of the first electrode of the transistor, the size of the first protrusion portion on the edge of the data line can be reduced as much as possible without affecting the normal operation of the transistor, which is beneficial to reducing the size of the product design edge, solving the bad problems such as water ripple, image retention and the like caused by the longer first protrusion portion, and further improving the product performance. The semiconductor layer of the transistor is covered by the gate electrode (described later), which can block the light of the backlight from affecting the semiconductor layer of the transistor, while the semiconductor layer overlapping the data line is not blocked by the film layer where the gate electrode is located, and is easily irradiated by the light of the backlight, thus affecting the electrical properties of the semiconductor layer. In the display substrate provided by the embodiment of the present disclosure, by setting the size of the first protrusion portion to be smaller than that of the second protrusion portion, the shape of the semiconductor layer in the transistor can not be changed, but the length of protrusion portion in the semiconductor layer under the data line relative to the data line can be reduced, thereby reducing the influence of backlight on the semiconductor layer.

For example, as illustrated in FIG. 1 to FIG. 3, an orthographic projection of the first electrode 301 of the transistor 300 on the base substrate 100 completely falls within an orthographic projection of the semiconductor layer 200 on the base substrate 100.

For example, as illustrated in FIG. 1 to FIG. 3, the first electrode 301 of the transistor 300 has the planar shape of a U-shape, the second electrode 302 of the transistor 300 has the planar shape of a long strip inserted into the opening of the U-shape, and the second protrusion portion 220 surrounds the periphery of the U-shape. For example, the second size S2 of the second protrusion portion 220 may be the size of the second protrusion portion 220 in the direction parallel to the width of the first electrode 301.

For example, as illustrated in FIG. 1 to FIG. 3, the semiconductor layer 200 overlapping the first electrode 301 of the transistor 300 includes a part covered by the first electrode 301 and two parts uncovered by the first electrode 301. The two parts uncovered by the first electrode 301 include a part located inside the first electrode 301 and a part located outside the first electrode 301. The second protrusion portion 220 is the part, located outside the first electrode 301, of the two parts of the semiconductor layer 200 uncovered by the first electrode 301.

For example, as illustrated in FIG. 1 to FIG. 3, the second protrusion portion 220 includes a portion on at least one edge of both edges of the first electrode 301 of the transistor 300. For example, the second protrusion portion 220 may include two parts located on both sides of the first electrode 301 of the transistor 300, and the widths of the two parts may be the same or different.

For example, as illustrated in FIG. 1 to FIG. 3, the second size S2 is greater than 3 microns. For example, the second size S2 is greater than 2 microns. For example, the second size S2 ranges from 2 to 2.6 microns. For example, the second size S2 ranges from 3 to 5 microns.

For example, as illustrated in FIG. 1 and FIG. 2, the first protrusion portion 210 includes a first step 211 and a second step 212 which are stacked, the first step 211 is located between the second step 212 and the base substrate 100, and a size of an interval between an edge of the first step 211 and the edge of the data line 410 is a first step size, that is, the first size S1, and a size of an interval between an edge of the second step 212 and the edge of the data line 410 is a second step size S11, the first step size is greater than the second step size S11.

For example, as illustrated in FIG. 2, a ratio of the first step size to the second step size ranges from 2 to 25. For example, that ratio of the first step size to the second step size range from 3 to 20. For example, the ratio of the first step size to the second step size ranges from 5 to 15. For example, the ratio of the first step size to the second step size ranges from 8 to 12.

For example, as illustrated in FIG. 1 and FIG. 2, the first step 211 and the second step 212 may be an integrated structure. For example, a material of the first step 211 includes amorphous silicon (a-Si), and a material of the second step 212 includes doped amorphous silicon. For example, the second step 212 may be N-type doped amorphous silicon (N+a-Si), and the material of the second step 212 may be doped with phosphorus. Doping amorphous silicon can effectively reduce the contact resistance between amorphous silicon (a-Si) and the film where the data line is located, and form a good ohmic contact.

For example, as illustrated in FIG. 2, a thickness of the first step 211 is greater than a thickness of the second step 212 in a direction perpendicular to a main surface of the base substrate 100 (also referred to as the direction perpendicular to the base substrate 100), such as the Z direction.

For example, as illustrated in FIG. 2, a side wall of the first step 211 away from the data line 410 may be an inclined side wall, and a side wall of the second step 212 away from the data line 410 may be an inclined side wall. The angles of the side wall of the first step 211 and the side wall of the second step 212 with respect to the main surface (the surface perpendicular to the Z direction) of the base substrate 100 are different. The first step as mentioned above includes a surface substantially parallel to the base substrate and a surface with a certain angle with the base substrate, and the side wall of the first step refers to the surface with a certain angle with the base substrate. The second step includes a surface substantially parallel to the base substrate and a surface with a certain angle with the base substrate, and the side wall of the second step refers to the surface with a certain angle with the base substrate.

For example, as illustrated in FIG. 2, the angle between the side wall of the first step 211 and the base substrate 100 is greater than the angle between the side wall of the second step 212 and the base substrate 100. But the present disclosure is not limited thereto, the angle between the side wall of the first step 211 and the base substrate 100 may be smaller than the angle between the side wall of the second step 212 and the base substrate 100.

For example, as illustrated in FIG. 2, the angle between the side wall of the first step 211 and the base substrate 100 may be 40 to 60 degrees, and the angle between the side wall of the second step 212 and the base substrate 100 may be 20 to 40 degrees. For example, the angle between the side wall of the first step 211 and the base substrate 100 may be 45 to 55 degrees, and the angle between the side wall of the second step 212 and the base substrate 100 may be 30 to 38 degrees. For example, the angle between the side wall of the first step 211 and the base substrate 100 may be 50 to 52 degrees, and the angle between the side wall of the second step 212 and the base substrate 100 may be 35 to 37 degrees.

For example, as illustrated in FIG. 2, the data line 410 includes at least one conductive layer, and the cross section of the data line 410 cut by a plane parallel to the XZ plane may have a shape of trapezoidal, and the side of the trapezoid may be a line where the side wall of the data line 410 is cut by a plane parallel to the XZ plane. For example, the included angle between the side wall of the data line 410 and the surface of the second step 212 away from the base substrate 100 ranges from 30 to 80 degrees. For example, the included angle between the side wall of the data line 410 and the surface of the second step 212 away from the base substrate 100 ranges from 40 to 70 degrees. For example, the included angle between the side wall of the data line 410 and the surface of the second step 212 away from the base substrate 100 ranges from 50 to 60 degrees.

For example, as illustrated in FIG. 2, the data line 410 includes a first metal layer 411, a second metal layer 412, and a third metal layer 413 which are sequentially stacked in a direction perpendicular to the base substrate 100. The first metal layer 411 is located between the second metal layer 412 and the base substrate 100, and the material of the first metal layer 411 is the same as that of the third metal layer 413, but the material of the first metal layer 411 is different from that of the second metal layer 412. For example, the materials of the first metal layer 411 and the third metal layer 413 may both be molybdenum, and the material of the second metal layer 412 may be aluminum. The embodiment of the present disclosure is not limited thereto, and the material of the data line can also adopt metal materials such as copper.

For example, as illustrated in FIG. 2, the thickness of the first metal layer 411 and the thickness of the third metal layer 413 are both smaller than the thickness of the second metal layer 412. For example, the thickness of the third metal layer 413 is greater than that of the first metal layer 411. For example, the thickness of the data line 410 is 2000 to 6000 angstroms.

For example, as illustrated in FIG. 2, the thickness of the semiconductor layer 200 is smaller than that of the conductive layer 400. For example, the thickness of the semiconductor layer 200 may be 1000 to 5000 angstroms. For example, the thickness of the semiconductor layer 200 may be 1000 to 2000 angstroms.

For example, as illustrated in FIG. 3, the second protrusion portion 220 includes a third step 221 and a fourth step 222 which are stacked. The third step 221 is located between the fourth step 222 and the base substrate 100, and a size of an interval between an edge of the third step 221 and the edge of the first electrode 301 of the transistor 300 is a third step size, that is, the second size S2, and a size of an interval between an edge of the fourth step 222 and the edge of the first electrode 301 is a fourth step size S21, and the fourth step size S21 is less than the third step size.

For example, as illustrated in FIG. 1 and FIG. 3, the third step 221 and the fourth step 222 may be an integrated structure. For example, the material of the third step 221 includes amorphous silicon (a-Si), and the material of the fourth step 222 includes doped amorphous silicon. For example, the fourth step 222 may be N-type doped amorphous silicon (N+a-Si), and the material of the fourth step 222 may be doped with phosphorus. Doping amorphous silicon can effectively reduce the contact resistance between amorphous silicon (a-Si) and the film where the data line is located, and form a good ohmic contact.

For example, as illustrated in FIG. 3, the thickness of the third step 221 is greater than that of the fourth step 222 in a direction perpendicular to the base substrate 100, such as the Z direction.

For example, as illustrated in FIG. 1 to FIG. 3, the first step 211 and the third step 221 may be made of the same material, and the second step 212 and the fourth step 222 may be made of the same material. For example, the thickness of the first step 211 and the thickness of the third step 221 may be the same, and the thickness of the second step 212 and the thickness of the fourth step 222 may be the same.

For example, as illustrated in FIG. 1 to FIG. 3, the first step size is smaller than the third step size.

For example, the first step size may be 0.5 to 2 microns. For example, the first step size is not more than 1.8 microns. For example, the first step size is not more than 1.6 microns. For example, the first step size is not more than 1.4 microns. For example, the first step size is not more than 1.3 microns. The first step size is not more than 1.3 microns. For example, the first step size is greater than 0.5 microns. For example, the first step size is greater than 1 micron. For example, the third step size is greater than 2 microns. For example, the third step size is 2 to 2.6 microns. For example, the third step size is 3 to 4 microns.

For example, as illustrated in FIG. 1 to FIG. 3, a ratio of the first step size to the second step size S11 is smaller than a ratio of the third step size to the fourth step size S21.

For example, as illustrated in FIG. 1 to FIG. 3, the ratio of the second step size S11 to the fourth step size S21 is 0.8 to 1.2. For example, the ratio of the second step size S11 to the fourth step size S21 is 0.9 to 1.1. For example, the second step size S11 is the same as the fourth step size S21. For example, the second step size S11 and the fourth step size S21 may be 0.1 to 0.5 microns.

By setting the second step size in the first protrusion portion to be the same as the fourth step size in the second protrusion portion, and setting the first step size in the first protrusion portion to be smaller than the third step size in the second protrusion portion, the embodiment of the present disclosure can reduce the size of the semiconductor layer at the edge of the data line without affecting the contact area between the doped amorphous silicon material and the conductive layer, so as to reduce the influence of the semiconductor layer protruding from the edge of the data line on product performance.

For example, as illustrated in FIG. 1, the connection portion 330 configured to connect the data line 410 with the first electrode 301 of the transistor 300 is also stacked with the semiconductor layer 200, and the extension direction of the part of the semiconductor layer 200 overlapping with the connection portion 330 is the same as that of the connection portion 330, and the part of the semiconductor layer includes a protrusion portion 240 which is not covered by the connection portion 330 and protrudes relative to the edge of the connection portion 330. The protrusion portion 240 is arranged on at least one side edge of the connection portion 330, and a size of an interval between an edge of the protrusion portion 240 away from the connection portion 330 and the edge of the connection portion 330 may be the same as the first size of the first protrusion portion 210, so as to minimize the influence of the semiconductor layer protruding relative to the edge of the connection portion on the product performance.

For example, as illustrated in FIG. 1 and FIG. 3, the transistor 300 further includes a gate electrode 303, which is located between the semiconductor layer 200 and the base substrate 100, and an orthographic projection of the second protrusion portion 220 on the base substrate 100 is located within an orthographic projection of the film layer where the gate electrode 303 is located on the base substrate 100. For example, the gate electrode 303 may overlap with one of the first electrode 301 and the second electrode 302 of the transistor 300 to form a storage capacitor.

For example, as illustrated in FIG. 2 and FIG. 3, the display substrate further includes a gate insulating layer 101 located between the semiconductor layer 200 and the base substrate 100 and on a side of the gate electrode 303 away from the base substrate 100. For example, the thickness of the gate insulating layer 101 may be 2500 to 4000 ang-stroms.

Figure 4:
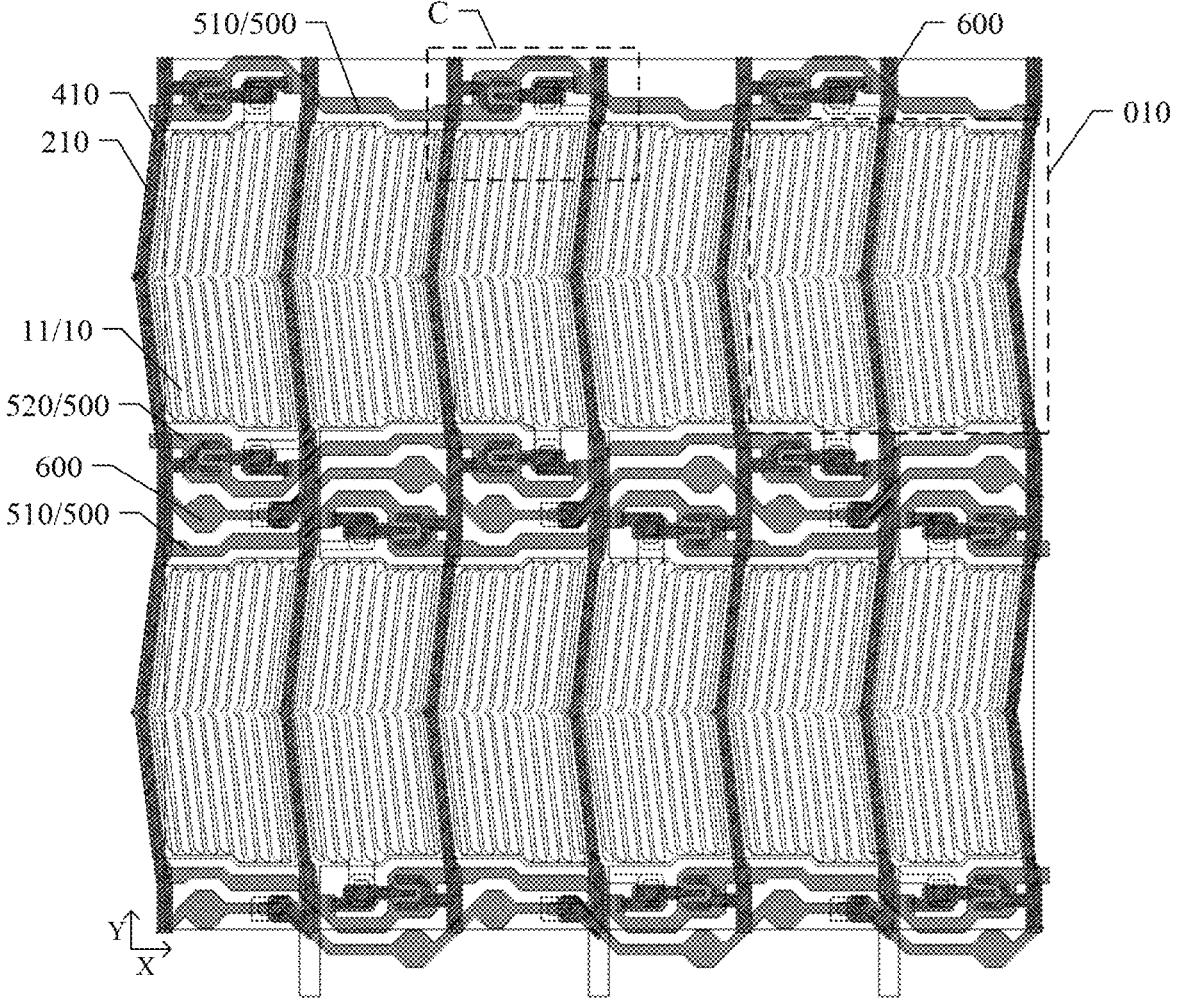
FIG. 4 is a schematic diagram of a partial plane structure of a display substrate provided according to an example of an embodiment of the present disclosure.

FIG. 4 is a schematic diagram of a partial plane structure of a display substrate provided according to an example of an embodiment of the present disclosure, and FIG. 1 is an enlarged view of a partial C of the display substrate shown in FIG. 4. For example, as illustrated in FIG. 1 to FIG. 4, the display substrate includes a plurality of sub-pixels 10, each of the plurality of sub-pixels 10 includes a pixel electrode 11, and the pixel electrode 11 is located on a side of the conductive layer 400 away from the base substrate 100. The second electrode 302 of the transistor 300 is electrically connected with the pixel electrode 11. For example, indium tin oxide can be used as the material of the pixel electrode 11. For example, the thickness of the pixel electrode 11 may be 400 to 1100 angstroms. For example, a passivation layer may be disposed between the pixel electrode 11 and the second electrode 302 of the transistor 300, and the thickness of the passivation layer may be 1000 to 6000 angstroms.

For example, the display substrate may also include a common electrode. For example, the common electrode may be located on a side of the pixel electrode away from the base substrate, and the plurality of sub-pixels may share the common electrode. For example, the common electrode may be located between the pixel electrode and the base sub-strate. For example, one of the pixel electrode and the common electrode may be a plate electrode, and the other may be a slit electrode. For example, the common electrode may be arranged in the same layer as the pixel electrode. For example, the display substrate may be an array substrate, and the common electrode may be disposed on an opposite substrate which is opposite to the display substrate. The embodiment of the present disclosure does not limit the positional relationship and shape of the common electrode and the pixel electrode, but can be set according to product requirements.

For example, as illustrated in FIG. 1, the semiconductor layer 200 further includes a third protrusion portion 230 overlapping the second electrode 302 of the transistor 300 and protruding relative to the edge of the second electrode 302. The third protrusion portion 230 surrounds at least part of the edge of the second electrode 302, and a size of the minimum interval between an edge of the third protrusion portion 230 away from the second electrode 302 and the edge of the second electrode 302 is a third size, which is greater than the first size. For example, the third size may be equal to the second size. Of course, the embodiment of the present disclosure is not limited to the third size being greater than the first size, and the third size may be equal to the first size. For example, in the embodiment of the present disclosure, there is an overlap between the extension part of the second electrode 302 of the transistor and the gate line 500 in the direction perpendicular to the base substrate, that is, there is an overlap between the semiconductor layer corresponding to this part and the gate line, and the existing overlapping portion forms a storage capacitor, which is conducive to improving the display effect.

For example, as illustrated in FIG. 1, the second electrode 302 of the transistor 300 includes a portion extending into the U-shaped opening of the first electrode 301 of the transistor 300 and another portion configured to be electri-cally connected with the pixel electrode 11. For example, another portion of the second electrode 302 of the transistor 300, which is configured to be electrically connected to the pixel electrode 11, is stacked with the semiconductor layer 200, and the edge of this part of the semiconductor layer 200 protrudes relative to the edge of the second electrode 302 to form the third protrusion portion 230.

For example, in the direction perpendicular to the base substrate 100, a part of the second electrode 302 of the transistor 300 overlaps with the film layer where the gate electrode 303 is located. For example, in the direction perpendicular to the base substrate 100, a part of the second electrode 302 of the transistor 300 overlaps with the doped region pattern 320 of the semiconductor layer 200, and another part of the second electrode 302 overlaps with some regions of the semiconductor layer 200 except the channel region 310 and the doped region pattern 320.

For example, as illustrated in FIG. 1 and FIG. 4, the display substrate further includes a gate line 500, which is arranged in the same layer as the gate electrode 303 of the transistor 300 and is electrically connected to the gate electrode 303. For example, the gate electrode 303 may be integrally provided with the gate line 500 electrically con-nected to the gate electrode.

For example, as illustrated in FIG. 1 and FIG. 4, the display substrate includes a plurality of sub-pixels 10 arrayed along the row direction and the column direction. The embodiment of the present disclosure schematically shows that the X direction is the row direction and the Y direction is the column direction, but it is not limited thereto, and the row direction and the column direction can be interchanged.

For example, as illustrated in FIG. 4, two adjacent sub-pixel columns form a sub-pixel column group 010, and the display substrate includes a plurality of sub-pixel column groups 010 arranged in the row direction, and each of the plurality of sub-pixels column group 010 includes two adjacent sub-pixel columns.

For example, the plurality of sub-pixels 10 may include a plurality of sub-pixels emitting different colors of light. For example, the plurality of sub-pixels 10 may include a plurality of red sub-pixels emitting red light, a plurality of green sub-pixels emitting green light and a plurality of blue sub-pixels emitting blue light. The red sub-pixels, green sub-pixels and blue sub-pixels may be repeatedly arranged in the row direction, and the sub-pixels arranged in the column direction may be sub-pixels emitting the same color of light, but it is not limited thereto, and the sub-pixels arranged in the column direction may also be repeatedly arranged in sequence.

For example, as illustrated in FIG. 1 and FIG. 4, the data lines 410 extend in the column direction and the gate lines 500 extend in the row direction. The extension of the data lines 410 in the column direction may mean that the overall extension direction of each data line 410 is in the column direction, and each data line 410 may be a straight line extending in the column direction or a broken line extending in the column direction. The extension of the gate lines 500 in the row direction may mean that the overall extension direction of each gate line 500 is in the row direction, and each gate line 500 may be a straight line extending in the row direction or a broken line extending in the row direction.

For example, as illustrated in FIG. 1 and FIG. 4, the gate lines 500 include a plurality of first sub-gate lines 510 and a plurality of second sub-gate lines 520. For example, the plurality of first sub-gate lines 510 and the plurality of second sub-gate lines 520 are alternately arranged in the column direction.

For example, as illustrated in FIG. 4, the data line 410 is located between two adjacent sub-pixel column groups 010, and two columns of sub-pixels in the sub-pixel column group 010 are electrically connected to the same data line 410.

For example, as illustrated in FIG. 4, the sub-pixel column group 010 includes a plurality of sub-pixel rows, and the first sub-gate line 510 and the second sub-gate line 520 are respectively arranged on both sides of each of the plurality of sub-pixels row along the column direction, and one gate line pair including one first sub-gate line 510 and one second sub-gate line 520 is disposed between adjacent sub-pixel rows. The display substrate provided by an example of the embodiment of the present disclosure can adopt a dual gate technology, which is a driving technology that reduces the number of data lines in the display device by half and doubles the number of gate lines, that is, the number of source drive integrated circuits (ICs) connected with data lines is halved and the number of gate drive integrated circuits connected with gate lines is doubled. Because the unit price of the gate drive IC is cheaper than that of the source drive IC, the cost is reduced.

For example, as illustrated in FIG. 4, the sub-pixel 10 further includes a common electrode, and the display substrate further includes a common electrode line 600 connected to the common electrode, and the common electrode line 600 may adopt a fold line shape. In the alignment process of liquid crystal display device, in the rubbing process of liquid crystal, the common electrode line with the fold line shape can guide the liquid crystal to rotate. For example, a spacer may be correspondingly provided at a position with a large width in the common electrode line 600.

Figures 5, 6A:
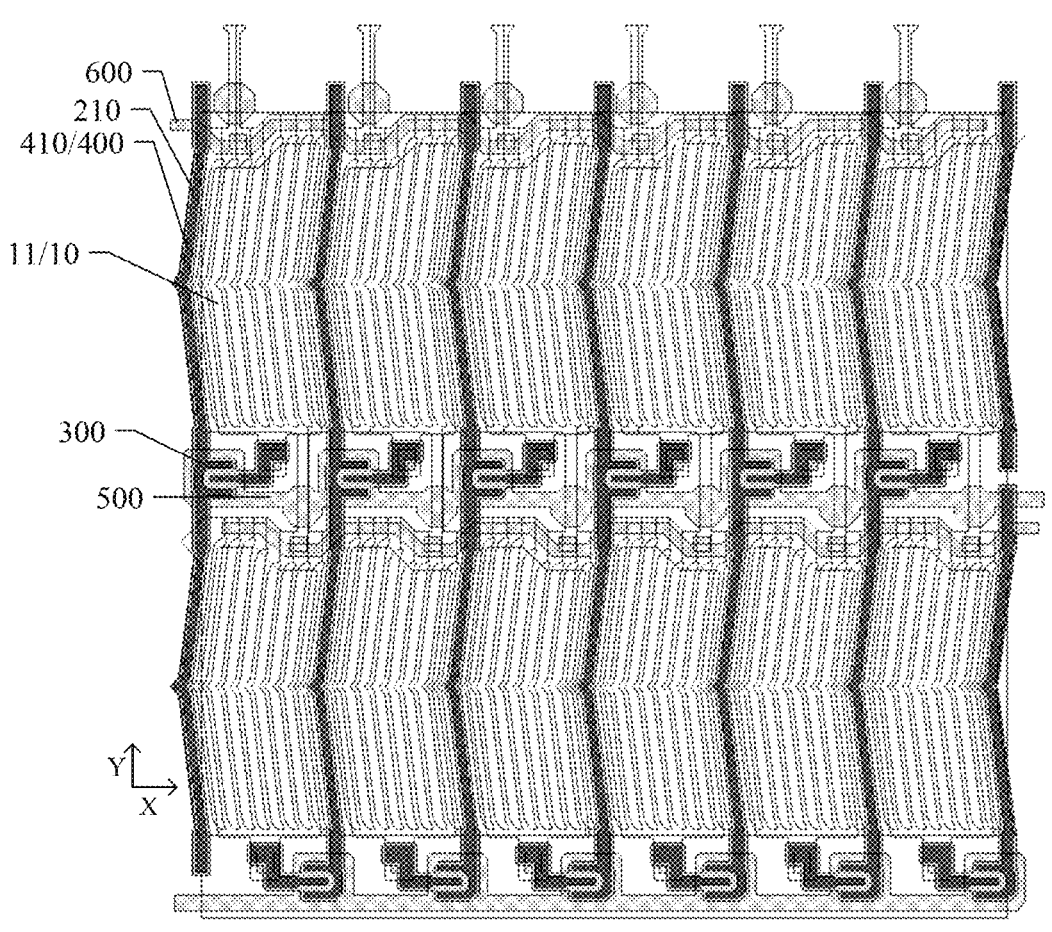
FIG. 5 is a schematic diagram of a partial plane structure of a display substrate provided according to another example of an embodiment of the present disclosure.
FIG. 6A to FIG. 6C are schematic diagrams of a method of manufacturing a partial cross-sectional structure of a display substrate taken along line DD' shown in FIG. 1.

FIG. 5 is a schematic diagram of a partial plane structure of a display substrate provided according to another example of an embodiment of the present disclosure. For example, the display substrate in the example shown in FIG. 5 is different from the display substrate in the examples shown in FIG. 1 to FIG. 4 in that the first electrode 301 of the transistor 300 has different positional relationship with the data line 410, and only one gate line is arranged between adjacent sub-pixel rows, and one data line is arranged between any adjacent sub-pixel columns, without adopting the double gate line technology. The first protrusion portion 210 of the semiconductor layer 200 protruding relative to the edge of the data line 410, the second protrusion portion 220 of the semiconductor layer 200 protruding relative to the edge of the first electrode 301, the data line 410, the gate line 500, the pixel electrode 11, etc. in the display substrate shown in FIG. 5 may be the same as those of the first protrusion portion 210, the second protrusion portion 220, the data line 410, the gate line 500, and the pixel electrode 11, etc. in the display substrate shown in FIG. 1.

For example, as illustrated in FIG. 5, the first electrode 301 of the transistor 300 and the data line 410 may have an integrated structure, which do not use the connection portion 330 shown in FIG. 1 for electrical connection.

For example, the display substrate provided by the embodiment of the present disclosure may be an array substrate.

For example, another embodiment of the present disclosure provides a display device including the display substrate provided by any of the above examples.

For example, the display device may further include a color film substrate disposed opposite to the array substrate, and a liquid crystal layer disposed between the array substrate and the color film substrate.

For example, the display device can be a liquid crystal display device, or any product or component with display function such as a television, a digital camera, a mobile phone, a watch, a tablet computer, a notebook computer, a navigator and the like including the liquid crystal display device, and this embodiment is not limited thereto.

Another embodiment of the present disclosure provides a manufacturing method for forming the display substrate shown in FIG. 1 to FIG. 4. FIG. 6A to FIG. 6C are schematic diagrams of a method of manufacturing a partial cross-sectional structure of a display substrate taken along line DD' shown in FIG. 1. As illustrated in FIG. 1, FIG. 6A to FIG. 6C, the manufacturing method of a display substrate includes providing a base substrate 100; forming a semiconductor material layer 20 on the base substrate 100; forming a conductive material layer 40 on a side of the semiconductor material layer 20 away from the base substrate 100; and forming an etching mask 800 on a side of the conductive material layer 40 away from the semiconductor material layer 20. As illustrated in FIG. 1, FIG. 6A to FIG. 6C, the etching mask 800 includes a first mask portion 810, which includes a first sub-mask portion 811 and a second sub-mask portion 812, the second sub-mask portion 812 is on at least one side of the first sub-mask portion 810, and the second sub-mask portion 812 is at the edge of the first mask portion 810, and the thickness of the first sub-mask portion 811 is greater than that of the second sub-mask portion 812 in the direction perpendicular to the base substrate 100. After the etching mask 800 is formed, the manufacturing method further includes patterning the conductive material layer 40 and the semiconductor material layer 20 with the first mask portion 810 as a mask to form the data line 410 and the first semiconductor pattern 23 (the first semiconductor pattern 23 shown in FIG. 17) between the data line 410 and the base substrate 100. The first semiconductor pattern 23 includes a first protrusion portion 210 that is not covered by the data line 410 and protrudes relative to the edge of the data line 410. The first protrusion portion 210 is arranged at the edge of the data line 410, and a size of an interval between an edge of the first protrusion portion 210 away from the data line 410 and the edge of the data line 410 is a first size S1; the first size S1 is greater than 0 and smaller than 3.0 microns. According to the embodiment of the present disclosure, the first mask portion with different thicknesses is used as a mask for patterning to form the data line and the first semiconductor pattern overlapping with the data line, which is beneficial to reducing the size of the first protrusion portion, further improving the product performance and reducing the probability of poor display of the display device.

For example, as illustrated in FIG. 6A to FIG. 6C, the first sub-mask portion 811 and the second sub-mask portion 812 have an integrated structure.

For example, as illustrated in FIG. 6A, a half-tone mask (HTM Mask) 910 can be used as a mask pattern to form the first mask portion 810 of the etching mask 800.

For example, the etching mask 800 may include photo-resist, and the etching mask layer is directly patterned by a half-tone mask process to form the first mask portion 810 with different thicknesses, that is, the first mask portion 810 includes the first sub-mask portion 811 and the second sub-mask portion 812 with different thicknesses. For example, the second sub-mask portion 812 is located at both sides of the first sub-mask portion 811.

For example, as illustrated in FIG. 6A, the half-tone mask 910 includes a high light transmission part 911, a low light transmission part 912, and a light shielding part 913. The half-tone mask 910 can form the first mask portions 810 with different thicknesses by using the characteristic that the light transmittance of different positions is different. For example, in one example, the etching mask layer is first formed, and then the etching mask layer is exposed by a half-tone mask 910. The fully exposed region 901 is formed at the position where the edge of the etching mask layer of the conductive material layer 40 needs to be exposed, the partially exposed region 902 is formed at the position where the second sub-mask portion 812 needs to be formed, and the region 903 where the first sub-mask portion 811 needs to be formed is not exposed. Then, the exposed etching mask layer is developed to form first mask portion 810 with different thicknesses. The example is described by taking the etching mask layer as an example of using a material including a positive photoresist. The example is not limited thereto, for example, a material including a negative photoresist may also be used.

For example, as illustrated in FIG. 6B, a slit mask (SSM Mask) 920 can be used as a mask pattern to form the first mask portion 810 of the etching mask 800.

For example, the etching mask 800 may include photo-resist, and the etching mask layer is directly patterned by a slit mask process to form the first mask portion 810 with different thicknesses, that is, the first mask portion 810 includes a first sub-mask portion 811 and a second sub-mask portion 812 with different thicknesses. For example, the second sub-mask portion 812 is located at both sides of the first sub-mask portion 811.

FIG. 6D includes a plan structure diagram of the slit mask shown in FIG. 6B and FIG. 7B. For example, as illustrated in FIG. 6B and FIG. 6D, the slit mask 920 includes a light transmission part 921 and a light-shielding part 922. The light transmission part 921 may include slits, and the slit mask 920 realizes that the light transmittance of one part of the region 904 is lower than that of the other part of the region 905 by diffraction of light, and the region 905 may be a partially exposed region. For example, slits may be located near the edge on both sides of the slit mask 920 to form a partial exposure region near the edge of the slit mask 920.

For example, in one example, the etching mask layer is first formed, and then the etching mask layer is exposed by the slit mask 920. The fully exposed region is formed at the position where the edge of the etching mask layer needs to expose the conductive material layer 40, the partially exposed region 905 is formed at the position where the second sub-mask portion 812 needs to be formed, and the region 904 where the first sub-mask portion 811 needs to be formed is not exposed. Then, the exposed etching mask layer is developed to form first mask portion 810 with different thicknesses. This example is described by taking the etching mask layer as an example of using a material including a positive photoresist. The example is not limited thereto, for example, a material including a negative photoresist may also be used.

For example, as illustrated in FIG. 6B and FIG. 6D, the slit mask 920 includes a slit with a width s1 of 0.8 to 3 microns. For example, the slit mask 920 includes a slit with a width s1 of 1 to 2 microns. For example, the width w1 of the light shielding part 922 on a side of the slit away from the center of the slit mask 920 may be 0.5 to 3 microns. For example, the width w1 of the light shielding part 922 on the side of the slit away from the center of the slit mask 920 may be 1 to 2 microns.

For example, FIG. 6C schematically shows that the first mask portion 810 of the etching mask 800 is patterned by using a half-tone mask (HTM Mask) 910 as a mask, but it is not limited thereto, and the first mask portion 810 of the etching mask 800 shown in FIG. 6C can also be patterned by using a slit mask (SSM Mask) 920 as a mask. For example, in the first mask portion 810 patterned by using the half-tone mask (HTM Mask) 910 or the slit mask (SSM Mask) 920, the second sub-mask portion 812 with obvious slope as illustrated in FIG. 6A to FIG. 6B may be formed, or the second sub-mask portion 812 with less obvious slope as illustrated in FIG. 6C may be formed. For example, as illustrated in FIG. 6C, the slope angle of the second sub-mask portion 812 may be 10 to 30 degrees. For example, the slope angle of the second sub-mask portion 812 may be 15 to 25 degrees. The slope angle of the second sub-mask portion 812 may be 18 degrees. The slope angle of the second sub-mask portion 812 may refer to the angle between the tangent line and the X direction at the intersection point where the curve of the curved surface cut by the XZ plane contacts the conductive material layer 40. For example, the angle between the tangent line at the midpoint of the curve where the curved surface of the second sub-mask portion 812 is cut by the XZ plane and the X direction may be 26 to 46 degrees. For example, the angle between the tangent line at the midpoint of the curve where the curved surface of the second sub-mask portion 812 is cut by the XZ plane and the X direction may be 30 to 40 degrees. For example, the angle between the tangent line and the X direction at the midpoint of the curve where the curved surface of the second sub-mask portion 812 is cut by the XZ plane may be 36 degrees.

For example, as illustrated in FIG. 6A to FIG. 6C, the thickness H1 of the first sub-mask portion 811 may be 1.5 to 3.0 microns. For example, the thickness H2 of the second sub-mask portion 812 may be 0.2 to 1.5 microns.

For example, as illustrated in FIG. 6A to FIG. 6C, the material of the semiconductor material layer 20 may include amorphous silicon and doped amorphous silicon. For example, doped amorphous silicon may be located on the side of amorphous silicon facing the conductive material layer 40. For example, the thickness of the semiconductor material layer 20 may be 1000 to 5000 angstroms. For example, the thickness of the semiconductor material layer 20 may be 1000 to 2000 angstroms.

For example, as illustrated in FIG. 6A to FIG. 6C, the conductive material layer 40 may include at least one film layer. For example, the material of the conductive material layer 40 may include metal materials such as molybdenum, aluminum and copper.

For example, as illustrated in FIG. 6A to FIG. 6C, before the semiconductor material layer 20 is formed, a gate metal layer can be deposited on the base substrate 100, and the gate electrode 303 and the gate line 500 shown in FIG. 1, FIG. 3 and FIG. 4 can be formed after the gate metal layer is exposed and etched.

For example, as illustrated in FIG. 6A to FIG. 6C, after the gate electrode 303 and the gate line 500 are formed, the gate insulating layer 101 is deposited on the side of the gate line 500 away from the base substrate.

FIG. 7A to FIG. 7C are schematic diagrams of a method of manufacturing a partial cross-sectional structure of a display substrate taken along line EE' shown in FIG. 1. For example, as illustrated in FIG. 1, FIG. 6A to FIG. 7C, the etching mask 800 further includes a second mask portion 820, which includes a third sub-mask portion 821 at the edge of the second mask portion, and the thickness of the third sub-mask portion 821 is the same as that of the first sub-mask portion 811 in the direction perpendicular to the base substrate 100. For example, as illustrated in FIG. 7A and FIG. 7B, the second mask portion 820 has third sub-mask portions 821 at both side edges, and the edge of the third sub-mask portion 821 away from the second mask portion 820 is not provided with a structure with a thickness smaller than that of the third sub-mask portion 821.

For example, as illustrated in FIG. 7A to FIG. 7C, the second mask portion 820 further includes a fourth sub-mask portion 822, the thickness of which is smaller than that of the third sub-mask portion 821. For example, as illustrated in FIG. 7A to FIG. 7C, the second mask portion 820 includes three third sub-mask portions 821 and two fourth sub-mask portions 822, which are alternately arranged in the Y direction.

For example, as illustrated in FIG. 7A to FIG. 7C, the thickness H3 of the third sub-mask portion 821 may be 1.5 to 3.0 microns, and the thickness H4 of the fourth sub-mask portion 822 may be 0.2 to 1.5 microns.

For example, as illustrated in FIG. 1 and FIG. 7A to FIG. 7C, the first electrode 301 and the second electrode 302 of the transistor 300 can be formed with the third sub-mask portion 821 as a mask, and the channel region of the transistor 300 can be formed with the fourth sub-mask portion 822 as a mask.

For example, as illustrated in FIG. 7A, a half-tone mask (HTM Mask) 930 can be used as a mask pattern to form the second mask portion 820 of the etching mask 800.

For example, the etching mask 800 may include photoresist, and the etching mask layer is directly patterned by a half-tone mask process to form a second mask portion 820 with different thicknesses, that is, the second mask portion 820 includes a third sub-mask portion 821 and a fourth sub-mask portion 822 with different thicknesses.

For example, as illustrated in FIG. 7A, the half-tone mask 930 includes a high light transmission part 931, a low light transmission part 932, and a light shielding part 933, and the half-tone mask 930 can form the second mask portion 820 with different thicknesses by using the characteristic that the light transmittance of different positions is different. For example, in one example, the etching mask layer is first formed, and then the etching mask layer is exposed by the half-tone mask 930, a fully exposed region 901 is formed at the position where the edge of the etching mask layer needs to expose the conductive material layer 40, a partially exposed region 902 is formed at the position where the fourth sub-mask portion 822 needs to be formed, and no exposure is performed at the region 903 where the third sub-mask portion 821 needs to be formed. Then, the exposed etching mask layer is developed to form the second mask portion 820 with different thicknesses. The example is described by taking the etching mask layer as an example of using a material including a positive photoresist. The example is not limited thereto, for example, a material including a negative photoresist may also be used.

For example, as illustrated in FIG. 7B, a slit mask (SSM Mask) 940 can be used as a mask pattern to form the second mask portion 820 of the etching mask 800.

For example, the etching mask 800 may include photoresist, and the etching mask layer is directly patterned by a half-tone mask process to form the second mask portion 820 with different thicknesses, that is, the second mask portion 820 includes a third sub-mask portion 821 and a fourth sub-mask portion 822 with different thicknesses.

For example, as illustrated in FIG. 6D and FIG. 7B, the slit mask 940 includes a light transmission part 941 and a light-shielding part 942. The light transmission part 941 may include slits, and the slit mask 940 realizes that the light transmittance of a part of the region 904 is lower than that of another part of the region 905 by diffraction of light. The region 905 may be a partially exposed region, and the region 904 may be a non-exposed region. For example, the slit can be located at the non-edge position of the slit mask 940, and the middle region and two side edge regions of the slit mask 940 are provided with larger light shielding parts 942 to form non-exposed regions at the middle region and two side edge regions of the slit mask 920, a partially exposed region at the middle of the two non-exposed regions of the slit mask 920, and a fully exposed region at the side of the non-exposed region at the edge away from the partially exposed region.

For example, in one example, the etching mask layer is first formed, and then the etching mask layer is exposed by the slit mask 940. The fully exposed region is formed at the position where the edge of the etching mask layer needs to expose the conductive material layer 40, the partially exposed region 905 is formed at the position where the fourth sub-mask portion 822 needs to be formed, and the region 904 where the third sub-mask portion 821 needs to be formed is not exposed. Then, the exposed etching mask layer is developed to form the second mask portion 820 with different thicknesses. The example is described by taking the etching mask layer as an example of using a material including a positive photoresist. The example is not limited thereto, for example, a material including a negative photoresist may also be used.

For example, as illustrated in FIG. 7B and FIG. 6D, the width s2 of each slit included in the slit mask 940 (such as the size of the slit in the Y direction) may be greater than 3 microns. For example, the width s2 of each slit included in the slit mask 940 may be 3 to 6 microns. For example, the width s2 of each slit included in the slit mask 940 may be 4.7 to 5.2 microns. For example, the width w2 of the light shielding part 942 with a larger size located between two adjacent slits may be 1.5 to 3 microns. For example, the width w2 of the light shielding part 942 with a larger size located between two adjacent slits may be 2.1 to 2.3 microns.

For example, FIG. 7C schematically shows that the second mask portion 820 of the etching mask 800 is patterned by using a half-tone mask (HTM Mask) 930 as a mask, but it is not limited thereto, and the second mask portion 820 of the etching mask 800 shown in FIG. 7C can also be patterned by using a slit mask (SSM Mask) 940 as a mask. For example, the second mask portion 820 patterned by using a half-tone mask (HTM Mask) 930 or a slit mask (SSM Mask) 940 as a mask has the edge cut by the YZ plane being approximately straight as illustrated in FIG. 7A to FIG. 8B, or has the edge cut by the YZ plane being curved as illustrated in FIG. 7C. For example, as illustrated in FIG. 7C, the slope angle of the curve of the second mask portion 820 cut by the YZ plane may be 35 to 55 degrees. For example, the slope angle of the curve of the second mask portion 820 cut by the YZ plane may be 40 to 50 degrees. For example, the slope angle of the curve of the second mask portion 820 cut by the YZ plane may be 45 degrees. The slope angle of the second mask portion 820 may refer to the angle between the tangent line and the Y direction at the intersection point of the curved surface cut by the YZ surface and the conductive material layer 40.

FIG. 8 is a schematic diagram of another method of manufacturing a partial cross-sectional structure of the display substrate taken along the line EE' shown in FIG. 1. FIG. 8 is different from FIG. 7A and FIG. 7C in that the third sub-mask portion 821 in the second mask portion 820 is not located at the edge position, and a fifth sub-mask portion 833 is provided at the edge position of the third sub-mask portion 821. In the direction perpendicular to the base substrate 100, the thickness of the third sub-mask portion 821 is the same as that of the first sub-mask portion 811, and the thickness of the fifth sub-mask portion 833 is the same as that of the second sub-mask portion.

For example, as illustrated in FIG. 8, the thickness H5 of the fifth sub-mask portion 823 may be 0.2 to 1.5 microns.

For example, as illustrated in FIG. 8, a half-tone mask (HTM Mask) 940 can be used as a mask pattern to form the second mask portion 820 of the etching mask 800. Of course, the embodiment of the present disclosure is not limited to form the second mask portion 820 shown in FIG. 8 by using a halftone mask portion as a mask, but may also form the second mask portion 820 shown in FIG. 8 by using a slit mask portion as a mask.

For example, the etching mask 800 may include photoresist, and the etching mask layer is directly patterned by a half-tone mask process to form a second mask portion 820 with different thicknesses, that is, the second mask portion 820 includes a third sub-mask portion 821, a fourth sub-mask portion 822 and a fifth sub-mask portion 823 with different thicknesses.

For example, as illustrated in FIG. 8, the half-tone mask 950 includes a high light transmission part 951, a low light transmission part 952, and a light shielding part 953. The second mask portions 820 with different thicknesses can be formed by the half-tone mask 950 with the characteristic that the light transmittance of different positions is different. For example, in one example, the etching mask layer is first formed, and then the etching mask layer is exposed with the half-tone mask 950. A fully exposed region 901 is formed at the position where the edge of the etching mask layer needs to expose the conductive material layer 40, a partially exposed region 902 is formed at the position where the fourth sub-mask portion 822 and the fifth sub-mask portion 823 need to be formed, and the region 903 where the third sub-mask portion 821 needs to be formed is not exposed. Then, the exposed etching mask layer is developed to form the second mask portion 820 with different thicknesses. The example is described by taking the etching mask layer as an example of using a material including a positive photoresist. The example is not limited thereto, for example, a material including a negative photoresist may also be used.

For example, it is different from the semiconductor layer of the transistor formed with the second mask portion 820 shown in FIG. 7A in that after the second mask portion 820 shown in FIG. 8 is formed, the second size of the second protrusion portion included in the semiconductor layer at the transistor patterned by the second mask portion 820 shown in FIG. 8 is the same as the first size of the first protrusion portion. The method of forming the subsequent structure by the second mask portion shown in FIG. 8 can refer to the structures formed by the corresponding methods in FIG. 10, FIG. 12, FIG. 14, FIG. 16 and FIG. 18, which will not be described here.

Optionally, refer to the position of the transistor corresponding to the semiconductor layer as illustrated in FIG. 8, the length of the second protrusion portion is greater than the first protrusion portion of the corresponding semiconductor position under the data line, that is, the distance between the edge of the data line layer and the edge of the semiconductor. Optionally, at least one of the position of the transistor corresponding to the semiconductor layer and the position of the corresponding semiconductor under the data line is prepared by the manufacturing method shown in FIG. 8, that is, the part of the semiconductor layer beyond the data line adopts the half-tone mask or the SSM mask, so as to realize that the mask has the stepped shape at the position where the semiconductor exceeds the data line.

FIG. 9 is a schematic diagram of forming a data line pattern by using a first mask portion as a mask, and FIG. 10 is a schematic diagram of forming a transistor source-drain pattern by using a second mask portion as a mask. For example, as illustrated in FIG. 6A, FIG. 6B and FIG. 9, patterning the conductive material layer 40 with the first mask portion 810 as a mask includes etching the conductive material layer 40 with the first mask portion 810 as a mask to form the data line pattern 41. For example, patterning the conductive material layer 40 with the first mask portion 810 as a mask includes wet etching the conductive material layer 40 with the first mask portion 810 as a mask to form the data line pattern 41. For example, the wet etching may be isotropic etching (e.g., etching in the X direction, Y direction and Z direction as illustrated in the figure), and the edge of the conductive material layer 40 is retracted by a certain size relative to the edge of the first mask portion 810.

For example, as illustrated in FIG. 7A, FIG. 7B and FIG. 10, the conductive material layer 40 is patterned with the second mask portion 820 as a mask to form the transistor source-drain electrode pattern 42. For example, the second mask portion 820 is used as a mask to etch the conductive material layer 40 to form the transistor source-drain electrode pattern 42. For example, the second mask portion 820 is used as a mask to wet etch the conductive material layer 40 to form the transistor source-drain electrode pattern 42. For example, the wet etching may be isotropic etching, and the edge of the conductive material layer 40 is retracted by a certain size relative to the edge of the second mask portion 820.

For example, as illustrated in FIG. 9 and FIG. 10, the data line pattern 41 and the transistor source-drain electrode pattern 42 are synchronously etched.

FIG. 11 is a schematic diagram of patterning the semiconductor material layer with the first mask portion as a mask to form the first semiconductor pattern layer, and FIG. 12 is a schematic diagram of patterning the semiconductor material layer with the second mask portion as a mask to form the second semiconductor pattern layer. For example, as illustrated in FIG. 9 and FIG. 11, after the data line pattern 41 is formed, the semiconductor material layer 20 is etched with the first mask portion 810 as a mask to form the first semiconductor pattern layer 21. For example, as illustrated in FIG. 9 and FIG. 11, patterning the semiconductor material layer 20 with the first mask portion 810 as a mask includes dry etching the semiconductor material layer 20 with the first mask portion 810 as a mask so that the edge of the first mask portion 810 and the edge of the semiconductor material layer 20 are etched simultaneously. For example, the dry etching can be anisotropic etching (for example, the etching is mainly in the Z direction shown in the figure, and the etching rate in other lateral directions such as the X direction is small), and the edge of the semiconductor material layer 20 is etched by the dry etching process, while the edge of the first mask portion 810 is simultaneously etched.

For example, as illustrated in FIG. 9 and FIG. 11, while the semiconductor material layer 20 is etched by the dry etching process, the second sub-mask portion 812 with smaller thickness is simultaneously etched. Compared with the case that the etching mask does not include the first sub-mask portion and the second sub-mask portion with different thicknesses, the embodiment of the present disclosure adopts the etching mask with the second sub-mask portion with smaller thickness at the edge of the etching mask, so that the etching amount of the second sub-mask portion with smaller thickness at the edge of the etching mask is larger, while the semiconductor material layer is etched by the dry etching process, thus providing a technological basis for the subsequent formation of the first semiconductor pattern with smaller first protrusion portion.

For example, as illustrated in FIG. 11, the edge position of the first semiconductor pattern layer 21 may be approximately the edge position of the first protrusion portion (Act tail) in the first semiconductor pattern formed subsequently, and therefore, the etching mask including the second sub-mask portion with a smaller edge thickness will affect the size of the first protrusion portion.

For example, compared with the process of ashing the first mask portion and then etching the semiconductor material layer to form the first semiconductor pattern layer, the method of synchronously etching the semiconductor material layer and the first mask portion by the dry etching process in the embodiment of the present disclosure can not only provide a process foundation for the subsequent formation of the first semiconductor pattern with smaller first protrusion portion, but also save one step of ashing process.

For example, as illustrated in FIG. 9 and FIG. 11, while the semiconductor material layer 20 is etched by dry etching, the first sub-mask portion 811 with a larger thickness is simultaneously etched.

For example, as illustrated in FIG. 9 and FIG. 11, the semiconductor material layer 20 is etched by a dry etching process, and the first mask portion 810 is etched at the same time, so that the etched first mask portion 810' is obtained. For example, the thicknesses of respective positions of the etched first mask portion 810' are smaller than the thicknesses of the corresponding positions of the first mask portion 810 (shown by dotted lines in FIG. 11).

For example, as illustrated in FIG. 11, while the first semiconductor pattern layer 21 is formed by etching, the material of the edge of the gate insulating layer 101 on the side away from the base substrate 100 will also be etched with a certain thickness.

For example, as illustrated in FIG. 10 and FIG. 12, patterning the semiconductor material layer 20 by using the second mask portion 820 as a mask includes etching the semiconductor material layer 20 with the second mask portion 820 as a mask to form the second semiconductor pattern layer 22 after forming the transistor source-drain electrode pattern 42. For example, patterning the semiconductor material layer 20 with the second mask portion 820 as a mask includes dry etching the semiconductor material layer 20 with the second mask portion 820 as a mask so that the edge of the second mask portion 820 and the edge of the semiconductor material layer 20 are etched simultaneously.

For example, as illustrated in FIG. 10 and FIG. 12, the semiconductor material layer 20 is etched by dry etching, and the second mask portion 820 is etched to obtain the etched second mask portion 820'. For example, the thickness of each position of the etched second mask portion 820' is smaller than the thickness of the corresponding position of the second mask portion 820 (shown by dotted lines in FIG. 12).

For example, as illustrated in FIG. 11 and FIG. 12, the first semiconductor pattern layer 21 and the second semiconductor pattern layer 22 are formed by simultaneous etching. For example, the first mask portion 810 and the second mask portion 820 are etched synchronously to form the etched first mask portion 810' and the etched second mask portion 820', respectively.

FIG. 13 is a schematic diagram after ashing the first mask portion which is etched, and FIG. 14 is a schematic diagram after ashing the second mask portion which is etched. For example, as illustrated in FIG. 9 to FIG. 14, after etching the semiconductor material layer 20 by using the first mask portion 810 and the second mask portion 820 as masks to form the first semiconductor pattern layer 21 and the second semiconductor pattern layer 22, the manufacturing method further includes simultaneously ashing the first mask portion 810 and the second mask portion 820. For example, ashing the first mask portion 810 (as shown by the dashed box in FIG. 13) includes ashing the etched first mask portion 810' to form an ashed first mask portion 810''. For example, ashing the second mask portion 820 (as shown by the dashed box in FIG. 14) includes ashing the etched second mask portion 820' to form an ashed second mask portion 820''.

For example, the slope angle of the edge of the ashed first mask portion 810'' may be 35 to 55 degrees. For example, the slope angle of the edge of the ashed first mask portion 810'' may be 45 degrees. For example, the slope angle of the edge of the ashed second mask portion 820'' may be 60 to 80 degrees. For example, the slope angle of the edge of the ashed second mask portion 820'' may be 70 degrees.

For example, as illustrated in FIG. 9 to FIG. 14, in the direction perpendicular to the base substrate 100, the thickness of the ashed first mask portion 810'' is smaller than that of the non-ashed first sub-mask portion 811. For example, the thickness of the ashed first mask portion 810'' is smaller than that of the etched first sub-mask portion.

For example, as illustrated in FIG. 13, the edge of the ashed first mask portion 810'' obtained by ashing the first mask portion which is etched may be flush with the edge of the data line pattern 41.

For example, as illustrated in FIG. 14, the edge of the ashed second mask portion 820'' obtained by ashing the second mask portion which is etched may be flush with the edge of the transistor source-drain electrode pattern 42.

For example, as illustrated in FIG. 9 to FIG. 14, in the direction perpendicular to the base substrate 100, the thickness of the ashed second mask portion 820'' is smaller than that of the non-ashed third sub-mask portion 830. For example, the thickness of the ashed first mask portion 810'' is smaller than the thickness of the etched third sub-mask portion.

For example, as illustrated in FIG. 14, the ashed second mask portion 820" includes a plurality of sub-mask portions arranged at intervals, the interval between adjacent sub-mask portions is configured to expose the channel region of the transistor, and each sub-mask portion is configured to shield one of the first electrode and the second electrode of the transistor.

FIG. 15 is a schematic diagram after etching the data line pattern with the first mask portion which is ashed as a mask, and FIG. 16 is a schematic diagram after etching the transistor source-drain electrode pattern with the ashed second mask portion as a mask. For example, as illustrated in FIG. 13 and FIG. 15, after the first mask portion and the second mask portion are simultaneously ashed, the manufacturing method further includes etching the data line pattern 41 by using the ashed first mask portion 810" as a mask to form the data line 410. For example, etching the data line pattern 41 by using the ashed first mask portion 810" as a mask to form the data line 410 includes wet etching the data line pattern 41 by using the ashed first mask portion 810" as a mask to form the data line 410, and the edge of the data line 410 is retracted by a certain size relative to the edge of the ashed first mask portion 810".

For example, as illustrated in FIG. 13 to FIG. 16, while the data line pattern 41 is etched to form the data line 410, the manufacturing method also includes etching the transistor source-drain electrode pattern 42 by using the ashed second mask portion 820" as a mask to form the first electrode 301 and the second electrode 302 of the transistor. For example, the first electrode 301 and the second electrode 302 of the transistor can be formed by wet etching, and the edges of the first electrode 301 and the second electrode 302 are both retracted by a certain size relative to the edge of the second mask portion 820" after ashing.

For example, as illustrated in FIG. 16, the first electrode 301 is spaced from the second electrode 302. For example, the interval between the first electrode 301 and the second electrode 302 is configured to expose a portion of the second semiconductor pattern layer 22.

FIG. 17 is a schematic diagram after etching the first semiconductor pattern layer with the first mask portion which is ashed as a mask, and FIG. 18 is a schematic diagram after etching the second semiconductor pattern layer with the ashed second mask portion as a mask. For example, as illustrated in FIG. 15 and FIG. 17, after the data line 410 is formed, the first semiconductor pattern 23 is formed by etching a certain thickness of the material of the edge of the first semiconductor pattern layer 21 away from the base substrate 10 using the ashed first mask portion 810" as a mask.

For example, as illustrated in FIG. 2 and FIG. 17, the first semiconductor pattern 23 includes a first step 211 and a second step 212. The first step 211 is located between the second step 212 and the base substrate 100, and a size of an interval between an edge of the first step 211 and the edge of the data line 410 is a first step size S1, and a size of an interval between an edge of the second step 212 and the edge of the data line 410 is a second step size S11; a ratio of that first step size S1 to the second step size S11 ranges from 2 to 25. For example, that ratio of the first step size to the second step size ranges from 3 to 20. For example, the ratio of the first step size to the second step size ranges from 5 to 15. For example, the ratio of the first step size to the second step size ranges from 8 to 12.

For example, the first step 211 and the second step 212 may be an integrated structure. For example, the material of the first step 211 includes amorphous silicon (a-Si), and the material of the second step 212 includes doped amorphous silicon. For example, the second step 212 may be N-type doped amorphous silicon (N+a-Si), and the material of the second step 212 may be doped with phosphorus.

For example, the material of the etched part of the first semiconductor pattern layer 21 at least includes doped amorphous silicon. For example, the material of the etched part of the first semiconductor pattern layer 21 may also include amorphous silicon.

For example, as illustrated in FIG. 3, FIG. 7A-FIG. 7B, FIG. 10, FIG. 12, FIG. 14. FIG. 16 and FIG. 18, after the etching mask is formed, the manufacturing method further includes patterning the conductive material layer 40 and the semiconductor material layer 20 with the second mask portion 820 as a mask to form the first electrode 301 and the second electrode 302 of the transistor 300 and the second semiconductor pattern 24 located between the first electrode 301 and the second electrode 302 of the transistor 300 and the base substrate 100. For example, the second semiconductor pattern 24 includes the channel region 310 and the doped region pattern 320 of the transistor 300. The protrusion portion of the edge of the second semiconductor pattern 24 that protrudes relative to the edge of the first electrode 301 (such as the edge of the first electrode 301 on a side away from the second electrode 302) is the second protrusion portion 220. Both the first electrode 301 and the second electrode 302 are electrically connected with the doped region pattern 320, and the first electrode 301 is electrically connected with the data line 410, a size of an interval between an edge of the second protrusion portion 220 away from the first electrode 301 and the edge of the first electrode 301 is a second size, and the second size is greater than the first size. In the embodiment of the present disclosure, by setting the size of the first protrusion portion of the edge of the semiconductor layer relative to the edge of the data line to be smaller than the size of the second protrusion portion of the edge of the semiconductor layer relative to the edge of the first electrode of the transistor, the size of the first protrusion portion on the edge of the data line can be reduced without affecting the normal operation of the transistor, which is beneficial to reducing the size of the product design edge, solving the bad problems such as water ripple, image retention and the like caused by the longer first protrusion portion, and further improving the product performance.

For example, as illustrated in FIG. 3 and FIG. 18, the second protrusion portion 220 includes a third step 221 and a fourth step 222 which are stacked, the third step 221 is located between the fourth step 222 and the base substrate 100, and a size of an interval between an edge of the third step 221 and the edge of the first electrode 301 of the transistor 300 is the third step size, that is, the second size S2, and a size of an interval between an edge of the fourth step 222 and the edge of the first electrode 301 is a fourth step size S21, and the fourth step size S21 is less than the third step size.

For example, as illustrated in FIG. 1 and FIG. 3, the third step 221 and the fourth step 222 may be an integrated structure. For example, the material of the third step 221 includes amorphous silicon (a-Si), and the material of the fourth step 222 includes doped amorphous silicon. For example, the fourth step 222 may be N-type doped amorphous silicon (N+a-Si), and the material of the fourth step 222 may be doped with phosphorus.

For example, the material of the etched part of the second semiconductor pattern layer 22 at least includes doped amorphous silicon. For example, the material of the etched part of the second semiconductor pattern layer 22 may also include amorphous silicon.

Compared with directly forming the first mask portion without the second sub-mask portion, the manufacturing method of the display substrate provided by the embodiment of the present disclosure forms the first mask portion including the second sub-mask portion by adopting a half-tone mask or a slit mask, and the size of the first protrusion portion of the first semiconductor pattern formed subsequently can be reduced without adding an additional mask process, so as to save the cost. Thereafter, the first protrusion portion (Act Tail) having the smaller size formed by two wet etching and two dry etching (2W2D) processes will form less photo-generated carriers under the irradiation of backlight, which is beneficial to improve the performance of products.

In the embodiment of the present disclosure, the edge of the etching mask used to form the semiconductor layer overlapping the data line includes the second sub-mask portion with smaller thickness (or the slope angle of the etching mask edge is smaller), and the edge of the etching mask used to form the semiconductor layer at the transistor position does not include the sub-mask portion with smaller thickness (or the slope angle of the etching mask edge is larger), so that the size of the formed second protrusion portion of the semiconductor layer at the transistor position protruding from the conductive layer is greater than the size of the formed first protrusion portion of the semiconductor layer overlapping the data line protruding from the data line. The semiconductor layer included in the transistor is covered by the gate electrode, which can block the light of the backlight from influencing the semiconductor layer at the transistor position, while the semiconductor layer overlapping with the data line is not blocked by the film layer where the gate electrode is located, and is easily irradiated by the light of the backlight, thus affecting the electrical properties of the semiconductor layer. In the display substrate provided by the embodiment of the present disclosure, by setting the size of the first protrusion portion to be smaller than that of the second protrusion portion, the shape of the semiconductor layer in the transistor can not be changed, but the length of the protrusion portion of the semiconductor layer under the data line relative to the data line can be reduced, thereby reducing the influence of backlight on the semiconductor layer.

For example, as illustrated in FIG. 16 and FIG. 18, after the first semiconductor pattern 23 and the second semiconductor pattern 24 are formed, the manufacturing method further includes removing the ashed etching mask to expose the data line 410 and the first electrode 301 and the second electrode 302 of the transistor.

For example, after the etching mask is removed, a passivation layer is formed on a side of the film layer where the data line 410 is located away from the base substrate 100. For example, after the passivation layer is formed, the manufacturing method further includes forming a pixel electrode on the side of the passivation layer away from the base substrate.

The following statements should be noted:
(1) In the accompanying drawings of the embodiments of the present disclosure, the drawings involve only the structure(s) in connection with the embodiment(s) of the present disclosure, and other structure(s) can be referred to common design(s).
(2) In the case of no conflict, features in one embodiment or in different embodiments can be combined.

What have been described above are only specific implementations of the present disclosure, the protection scope of the present disclosure is not limited thereto, and the protection scope of the present disclosure should be based on the protection scope of the claims.

The invention claimed is:

1. A display substrate, comprising:
a base substrate;
a semiconductor layer, on the base substrate, the semiconductor layer comprising a channel region and a doped region pattern of a transistor;
a conductive layer, stacked with the semiconductor layer, and located at a side of the semiconductor layer away from the base substrate, the conductive layer comprising a data line, and a first electrode and a second electrode of the transistor electrically connected with the doped region pattern, the first electrode being electrically connected with the data line,
wherein an extension direction of an overlapping portion of the semiconductor layer with the data line is the same as an extension direction of the data line, and the semiconductor layer comprises a first protrusion portion which is not covered by the data line and protrudes relative to an edge of the data line, the first protrusion portion is arranged at the edge of the data line, and a size of an interval between an edge of the first protrusion portion away from the data line and the edge of the data line is a first size, and the first size is greater than 0 and smaller than 3.0 microns,
a portion of an edge of the semiconductor layer protruding from an edge of the first electrode is a second protrusion portion, which is arranged at the edge of the first electrode, and a size of an interval between an edge of the second protrusion portion away from the first electrode and the edge of the first electrode is a second size, and the second size is greater than the first size.

2. The display substrate according to claim 1, the first protrusion portion comprises a first step and a second step which are stacked, the first step is located between the second step and the base substrate, and a size of an interval between an edge of the first step and the edge of the data line is a first step size, and a size of an interval between an edge of the second step and the edge of the data line is a second step size; a ratio of the first step size to the second step size ranges from 2 to 25.

3. The display substrate according to claim 2, wherein a material of the first step comprises amorphous silicon, and a material of the second step comprises doped amorphous silicon.

4. The display substrate according to claim 2, wherein the data line comprises at least one conductive layer, and an angle between a side wall of the data line and a surface of a side of the second step away from the base substrate ranges from 30 to 80 degrees.

5. The display substrate according to claim 2, wherein the second protrusion portion comprises a third step and a fourth step which are stacked, the third step is located between the fourth step and the base substrate, and a size of an interval between an edge of the third step and the edge of the first electrode is a third step size, and a size of an interval between an edge of the fourth step and the edge of the first electrode is a fourth step size;
the first step size is smaller than the third step size.

6. The display substrate according to claim 5, wherein a material of the third step comprises amorphous silicon, and a material of the fourth step comprises doped amorphous silicon.

7. The display substrate according to claim 5, wherein a ratio of the first step size to the second step size is smaller than a ratio of the third step size to the fourth step size.

8. The display substrate according to claim 1, wherein the transistor further comprises a gate electrode which is located between the semiconductor layer and the base substrate, and an orthographic projection of the second protrusion portion on the base substrate is located within an orthographic projection of a film layer where the gate electrode is located on the base substrate.

9. The display substrate according to claim 8, further comprising:

a plurality of sub-pixels, each of the plurality of sub-pixels comprising a pixel electrode, the pixel electrode being located at a side of the conductive layer away from the base substrate, wherein the second electrode is electrically connected with the pixel electrode;

the semiconductor layer further comprises a third protrusion portion overlapping the second electrode and protruding relative to an edge of the second electrode, the third protrusion portion surrounds at least part of the edge of the second electrode, and a size of a smallest interval between an edge of the third protrusion portion away from the second electrode and the edge of the second electrode is a third size, and the third size is greater than the first size.

10. The display substrate according to claim 9, further comprising:

gate lines, arranged in the same layer as the gate electrode and electrically connected with the gate electrode, wherein the plurality of sub-pixels are arrayed along a row direction and a column direction, and two adjacent sub-pixel columns form a sub-pixel column group;

the data line extends in the column direction, the gate lines extend in the row direction, and the gate lines comprise a plurality of first sub-gate lines and a plurality of second sub-gate lines;

the data line is located between two adjacent sub-pixel column groups, and two columns of sub-pixels in the sub-pixel column group are electrically connected with the same data line;

the sub-pixel column group comprises a plurality of sub-pixel rows, and the first sub-gate line and the second sub-gate line are respectively arranged on both sides of each of the plurality of sub-pixels row in the column direction, and a gate line pair including the first sub-gate line and the second sub-gate line is between adjacent sub-pixel rows.

11. The display substrate according to claim 5, wherein a ratio of the second step size to the fourth step size ranges from 0.8 to 1.2.

12. A display device, comprising the display substrate according to claim 1.

13. A manufacturing method of a display substrate, comprising:

providing a base substrate;

forming a semiconductor material layer on the base substrate;

forming a conductive material layer on a side of the semiconductor material layer away from the base substrate; and forming an etching mask on a side of the conductive material layer away from the semiconductor material layer, wherein the etching mask comprises a first mask portion, the first mask portion comprises a first sub-mask portion and a second sub-mask portion, the second sub-mask portion is on at least one side of the first sub-mask portion, and the second sub-mask portion is at an edge of the first mask portion, and a thickness of the first sub-mask portion is greater than that of the second sub-mask portion in a direction perpendicular to the base substrate, after the etching mask is formed, the manufacturing method further comprises:

patterning the conductive material layer and the semiconductor material layer with the first mask portion as a mask to form a data line and a first semiconductor pattern between the data line and the base substrate, wherein the first semiconductor pattern comprises a first protrusion portion which is not covered by the data line and protrudes relative to an edge of the data line, the first protrusion portion is arranged at the edge of the data line, and a size of an interval between an edge of the first protrusion portion away from the data line and the edge of the data line is a first size; and the first size is greater than 0 and smaller than 3.0 microns, the etching mask further comprises a second mask portion, and the second mask portion comprises a third sub-mask portion located at an edge position, and a thickness of the third sub-mask portion is the same as the thickness of the first sub-mask portion in the direction perpendicular to the base substrate;

after the etching mask is formed, the manufacturing method further comprises:

patterning the conductive material layer and the semiconductor material layer with the second mask portion as a mask to form a first electrode and a second electrode of a transistor and a second semiconductor pattern located between the first electrode and the second electrode of the transistor and the base substrate, wherein the second semiconductor pattern comprises a channel region and a doped region pattern of the transistor, and a protrusion portion of an edge of the second semiconductor pattern protruding relative to an edge of the first electrode is a second protrusion portion, the first electrode and the second electrode are both electrically connected with the doped region pattern, the first electrode is electrically connected with the data line, and a size of an interval between an edge of the second protrusion portion away from the first electrode and the edge of the first electrode is a second size, and the second size is greater than the first size.

14. The manufacturing method according to claim 13, wherein patterning the conductive material layer and the semiconductor material layer with the first mask portion as a mask comprises:

etching the conductive material layer with the first mask portion as a mask to form a data line pattern;

etching the semiconductor material layer with the first mask portion as a mask to form a first semiconductor pattern layer after forming the data line pattern.

15. The manufacturing method according to claim 14, wherein patterning the conductive material layer and the semiconductor material layer with the first mask portion as a mask comprises:

wet etching the conductive material layer with the first mask portion as a mask to form the data line pattern, and dry etching the semiconductor material layer with the first mask portion as a mask to synchronously etch edges of the first mask portion and the semiconductor material layer.

16. The manufacturing method according to claim 13, wherein patterning the conductive material layer and the semiconductor material layer with the second mask portion as a mask comprises:

etching the conductive material layer with the second mask portion as a mask to form a transistor source-drain electrode pattern;

after forming the transistor source-drain electrode pattern, etching the semiconductor material layer with the second mask portion as a mask to form a second semiconductor pattern layer.

17. The manufacturing method according to claim 16, wherein after etching the semiconductor material layer with the first mask portion and the second mask portion as masks to form the first semiconductor pattern layer and the second semiconductor pattern layer, the manufacturing method further comprises:

simultaneously ashing the first mask portion and the second mask portion, wherein, in a direction perpendicular to the base substrate, a thickness of the first mask portion which is ashed is smaller than that of the first sub-mask portion which is not ashed.

18. The manufacturing method according to claim 17, wherein, after the first mask portion and the second mask portion are simultaneously ashed, the manufacturing method further comprises:

etching the data line pattern with the first mask portion which is ashed as a mask to form the data line;

after the data line is formed, etching an edge of the first semiconductor pattern layer with the first mask portion which is ashed as a mask to form a first step and a second step, wherein the first semiconductor pattern comprises the first step and the second step, the first step is located between the second step and the base substrate, and a size of an interval between an edge of the first step and the edge of the data line is a first step size, and a size of an interval between an edge of the second step and the edge of the data line is a second step size;

a ratio of the first step size to the second step size ranges from 2 to 25.

\* \* \* \* \*